United States Patent
Ji et al.

(10) Patent No.: US 9,837,566 B2
(45) Date of Patent: Dec. 5, 2017

(54) PHOTODIODES INCLUDING SEED LAYER

(71) Applicant: Samsung Electronics Co., Ltd.

(72) Inventors: Ho-Chul Ji, Yongin-si (KR); Keun-Yeong Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/957,293

(22) Filed: Dec. 2, 2015

(65) Prior Publication Data

US 2016/0197216 A1    Jul. 7, 2016

(30) Foreign Application Priority Data

Jan. 5, 2015    (KR) ......................... 10-2015-0000859

(51) Int. Cl.
*H01L 31/036*    (2006.01)
*H01L 31/0384*    (2006.01)
*H01L 31/028*    (2006.01)

(52) U.S. Cl.
CPC ...... *H01L 31/03845* (2013.01); *H01L 31/028* (2013.01); *H01L 31/036* (2013.01); *Y02E 10/547* (2013.01)

(58) Field of Classification Search
CPC ............ H01L 31/1808; H01L 31/1812; H01L 31/036–31/0392; H01L 31/00–31/208
See application file for complete search history.

(56) References Cited

U.S. PATENT DOCUMENTS

| | | | |
|---|---|---|---|
| 7,012,314 B2 | 3/2006 | Bude et al. | |
| 7,358,107 B2 | 4/2008 | Maa et al. | |
| 7,361,526 B2 * | 4/2008 | Maa | H01L 31/105 257/E21.131 |
| 8,034,697 B2 * | 10/2011 | Fiorenza | H01L 21/02381 257/E21.09 |
| 8,253,211 B2 | 8/2012 | Cheng et al. | |
| 8,294,213 B2 * | 10/2012 | Miura | H01L 21/02381 257/184 |
| 8,319,237 B2 | 11/2012 | Liu | |
| 8,330,242 B2 | 12/2012 | Shiba et al. | |
| 8,728,850 B2 | 5/2014 | Ji et al. | |
| 8,853,812 B2 * | 10/2014 | Okamoto | G02B 6/12004 257/458 |
| 9,269,869 B2 * | 2/2016 | Okumura | H01S 5/3223 |

(Continued)

FOREIGN PATENT DOCUMENTS

| | | |
|---|---|---|
| JP | 5152874 B2 | 12/2012 |
| JP | 2013-83680 A | 5/2013 |
| JP | 5477148 B2 | 2/2014 |

OTHER PUBLICATIONS

Fiorenza et al., "Aspect Ratio Traping: a Unique Technology for Integrating Ge and III-Vs with Silicon CMOS", *ECS Transactions*, 33(6):963-976, Oct. 2010.

(Continued)

*Primary Examiner* — Eric Ward
(74) *Attorney, Agent, or Firm* — Myers Bigel, P.A.

(57) ABSTRACT

A photodiode includes a semiconductor substrate, a crystalline layer on the semiconductor substrate, an insulating pattern layer on the crystalline layer to define a plurality of holes exposing a top surface of the crystalline layer, a seed layer in the plurality of holes and directly on the crystalline layer, and a light absorption layer on the seed layer and the insulating pattern layer.

11 Claims, 35 Drawing Sheets

(56) References Cited

U.S. PATENT DOCUMENTS

| | | | | |
|---|---|---|---|---|
| 2006/0113596 A1* | 6/2006 | Cho | ................. | H01L 21/02381 257/347 |
| 2006/0292719 A1* | 12/2006 | Lochtefeld | ........ | H01L 21/02381 438/22 |
| 2009/0039361 A1* | 2/2009 | Li | ..................... | H01L 21/02381 257/94 |
| 2012/0025265 A1* | 2/2012 | Ji | ...................... | H01L 31/02327 257/184 |
| 2012/0314993 A1 | 12/2012 | Kang et al. | | |

OTHER PUBLICATIONS

Hsu et al., "Nanoepitaxy of GaAs on a Si(001) substrate using a round-hole nanopatterned $SiO_2$ mask", *Nanotechnology*, vol. 23, Nov. 16, 2012, 6 pp.

* cited by examiner 11 31 13-2

PHOTODIODES INCLUDING SEED LAYER

CROSS-REFERENCE TO RELATED APPLICATION

This application claims the benefit of Korean Patent Application No. 10-2015-0000859, filed on Jan. 5, 2015, in the Korean Intellectual Property Office, the disclosure of which is incorporated herein in its entirety by reference.

BACKGROUND

The inventive concepts relate to photodiodes and optical communication systems including the same, and more particularly, to photodiodes that can provide improved photoelectric conversion efficiency and optical communication systems including the photodiodes.

A photodiode, which is a photoelectric device configured to convert a light signal into an electric signal, may be used for an image sensor and/or an optical communication system. To increase photoelectric conversion efficiency of the photoelectric device, it may be desirable to prevent loss of a light signal caused during a process of absorbing a light signal and leakage of an electric signal into which the light signal is converted.

SUMMARY

According to an aspect of the inventive concepts, there is provided a photodiode including a semiconductor substrate, a crystalline layer on the semiconductor substrate, an insulating pattern layer on the crystalline layer to define a plurality of holes exposing a top surface of the crystalline layer, a seed layer in the plurality of holes and directly on the crystalline layer, and a light absorption layer on the seed layer and the insulating pattern layer.

The semiconductor substrate may include a trench including therein an insulating layer, and the crystalline layer may be on the insulating layer.

The crystalline layer may extend on the insulating layer and include at least one line shape.

A width of each of the plurality of holes may be less than a width of the crystalline layer that extends in the at least one line shape.

A refractive index of the crystalline layer may be higher than a refractive index of the insulating layer.

The plurality of holes may include a plurality of island-shaped holes that are spaced apart from one another.

The plurality of holes may include a plurality of line-shaped holes that are spaced apart from one another.

The seed layer may include an epitaxial growth layer.

The light absorption layer may be unified with the seed layer.

The photodiode may further include a transmissive insulating layer on the light absorption layer.

Light transmitted through the crystalline layer may be transmitted through the seed layer to the light absorption layer in a direction perpendicular to the light absorption layer.

A top surface of the crystalline layer may include a first region including a first semiconductor material layer, and a top surface of the light absorption layer may include a second region including a second semiconductor material layer that comprises a different material from the first semiconductor material layer.

The seed layer connected to the crystalline layer may include a third semiconductor material layer that comprises the same material as the first semiconductor material layer.

A first region and a second region may be disposed in a top surface of the light absorption layer and spaced apart from each other. The first region may include a first semiconductor material layer, and the second region may include a second semiconductor material layer that comprises a different material from the first semiconductor material layer.

The photodiode may further include an electrode connected to the light absorption layer.

A thickness of the light absorption layer may be greater than a thickness of the seed layer.

According to another aspect of the inventive concepts, there is provided a photodiode that converts a light signal to an electric signal. The photodiode comprises a crystalline layer configured to transmit the light signal and being on an insulating layer within a trench of a semiconductor substrate, a plurality of seed structures directly on a top surface of the crystalline layer and configured to transmit the light signal, a light absorption layer directly on the plurality of seed structures and configured to absorb the light signal transmitted by the seed structures, and an electrode configured to transmit the electric signal, wherein the electric signal is generated from the light signal absorbed by the light absorption layer.

According to another aspect of the inventive concepts, there is provided an optical communication system including a light transmitter configured to convert a first electric signal into a light signal, a channel configured to transmit the light signal into which the first electric signal has been converted, and a light receiver configured to convert the light signal transmitted from the channel into a second electric signal. The light receiver includes a crystalline layer configured to transmit the light signal and being on an insulating layer within a trench of a semiconductor substrate, a plurality of seed structures directly on a top surface of the crystalline layer and configured to transmit the light signal, a light absorption layer directly on the plurality of seed structures and configured to absorb the light signal transmitted by the seed structures, and an electrode configured to transmit the second electric signal, wherein the second electric signal is generated from the light signal absorbed by the light absorption layer.

According to another aspect of the inventive concepts, there is provided a photodiode including a silicon substrate, a silicon crystalline layer on the silicon substrate, an insulating pattern layer on the silicon crystalline layer to define a plurality of holes exposing a top surface of the silicon crystalline layer, a germanium seed layer in the plurality of holes to be connected to the silicon crystalline layer, and a germanium layer on the germanium seed layer and the insulating pattern layer.

According to another aspect of the inventive concepts, there is provided a photodiode including a substrate, a seed layer that comprises plurality of crystalline seeds that are spaced apart from one another, on the substrate, and a light absorption layer directly on the seed layer and providing a unitary crystalline structure with the seed layer. The light absorption layer has lower threading dislocation density than the seed layer.

The crystalline seeds and the light absorption layer may comprise a same material.

The light absorption layer may be thicker than the seed layer.

The seed layer may comprise a plurality of island-shaped crystalline seeds and/or a plurality of line-shaped crystalline seeds that are spaced apart from one another.

A crystalline layer also may be provided on the seed layer opposite the light absorption layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
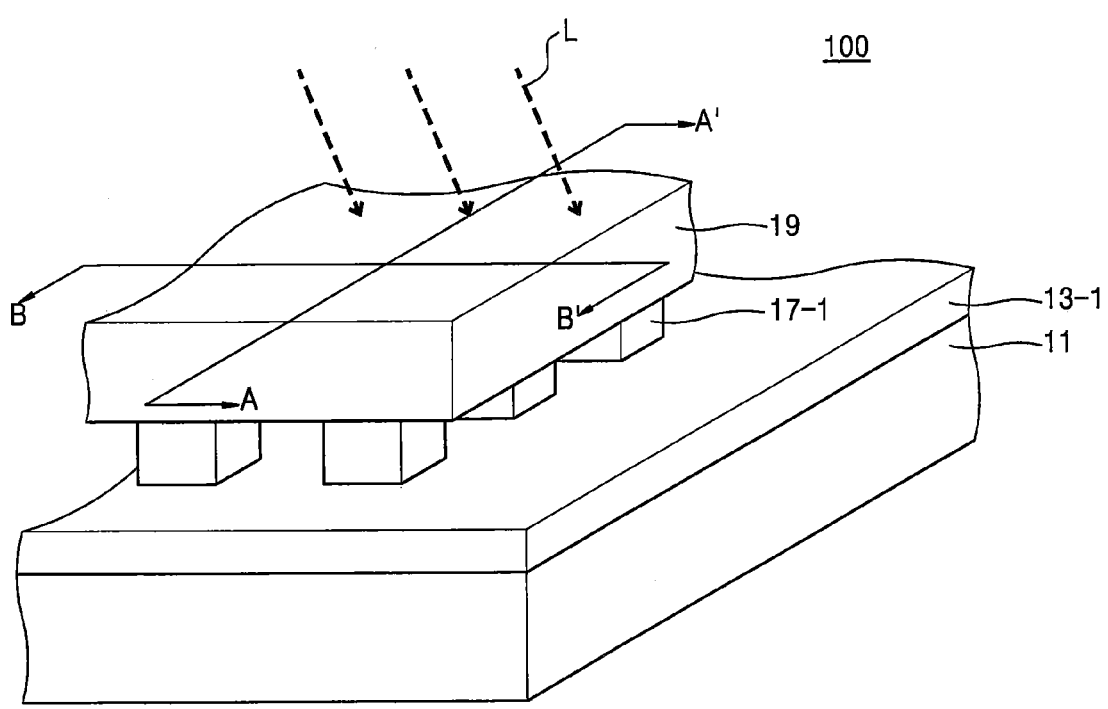
FIG. 1 is a diagram of a schematic structure of a photodiode according to an example embodiment.

As used herein, the term "and/or" includes any and all combinations of one or more of the associated listed items. Expressions such as "at least one of," when preceding a list of elements, modify the entire list of elements and do not modify the individual elements of the list.

The inventive concepts will now be described more fully hereinafter with reference to the accompanying drawings, in which example embodiments of the inventive concepts are shown. These inventive concepts may, however, be embodied in different forms and should not be construed as limited to the embodiments set forth herein. Rather, these embodiments are provided so that this disclosure is thorough and complete and fully conveys the scope of the inventive concepts to one skilled in the art.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

The terminology used herein to describe embodiments of the inventive concepts is not intended to limit the scope of the inventive concepts. The articles "a," "an," and "the" are singular in that they have a single referent; however, the use of the singular form in the present document should not preclude the presence of more than one referent. In other words, elements of the inventive concepts referred to in the singular form may number one or more, unless the context clearly indicates otherwise. It will be further understood that the terms "comprises," "comprising," "includes," "including," "has" and/or "having" (and variants thereof) when used herein, specify the presence of stated features, steps, operations, elements, and/or components, but do not preclude the presence or addition of one or more other features, steps, operations, elements, components, and/or groups thereof. It will be further understood that when an element or layer is referred to as being "on," "connected to," or "coupled to" another element or layer (and variants thereof), it can be directly on, connected to, or coupled to the other element or layer or intervening elements or layers may be present. In contrast, when an element is referred to as being "directly on," "directly connected to," or "directly coupled to" another element or layer (and variants thereof), there are no intervening elements or layers present.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant, art and will not be interpreted in an idealized or overly formal sense unless explicitly so defined herein.

Variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing.

In the drawings, sizes of constituent elements may be exaggerated for clarity.

FIG. 1 is a diagram of a schematic structure of a photodiode 100 according to an example embodiment.

Referring to FIG. 1, the photodiode 100 may include a semiconductor substrate 11, a crystalline layer 13-1 on the semiconductor substrate 11, a seed layer 17-1 including a plurality of structures to be connected to the crystalline layer 13-1, and a light absorption layer 19 directly on the seed layer 17-1. The plurality of structures included in the seed layer 17-1 may include pillar-type structures separated from one another.

External light L may be absorbed in a top surface of the light absorption layer 19. The external light L absorbed into the top surface of the light absorption layer 19 may be converted into an electric signal in the light absorption layer 19, and the electric signal may be transmitted through the seed layer 17-1 and the crystalline layer 13-1.

Figure 2A:
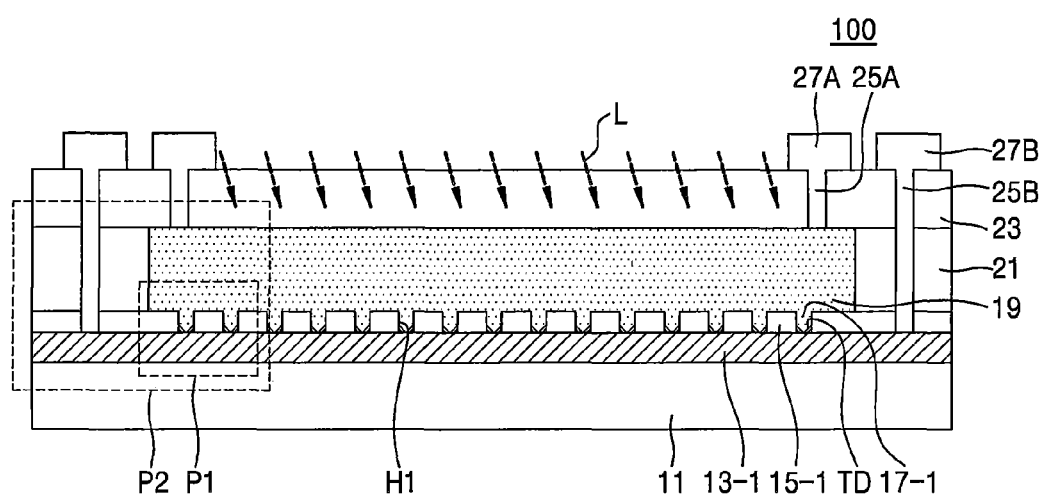
FIGS. 2A and 2B are cross-sectional views of a photodiode according to an example embodiment.
Figure 2B:
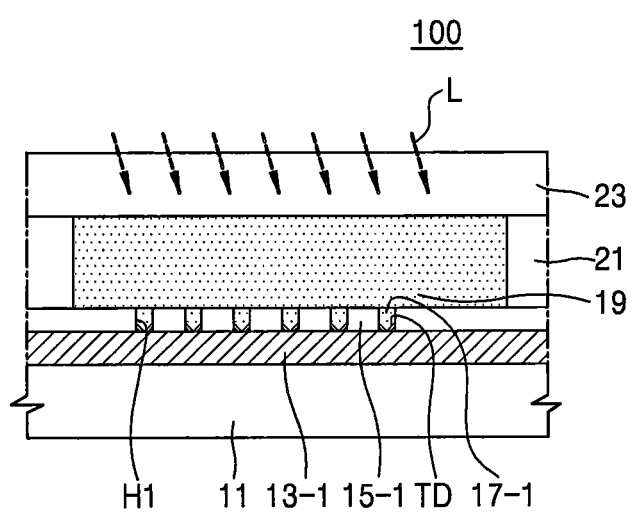

FIGS. 2A and 2B are cross-sectional views of the photodiode 100 of FIG. 1, according to an example embodiment. FIG. 2A is a cross-sectional view taken along a direction A-A' of FIG. 1, which illustrates the photodiode 100 in a wider range than in FIG. 1, and FIG. 2B is a cross-sectional view taken along a direction B-B' of FIG. 1, which illustrates the photodiode 100 in a wider range than in FIG. 1.

Referring to FIGS. 2A and 2B, the crystalline layer 13-1 may be formed on the semiconductor substrate 11. The semiconductor substrate 11, which may be a semiconductor wafer, may include crystalline silicon. In some example embodiments, the semiconductor substrate 11 may include a single semiconductor element, such as germanium (Ge), or a semiconductor compound, such as silicon carbide (SiC), gallium arsenide (GaAs), indium arsenide (InAs), and indium phosphide (InP). In some example embodiments, the semiconductor substrate 11 may be crystalline (e.g., single crystalline or polycrystalline) or amorphous. In some embodiments, the semiconductor substrate 11 may include a conductive region, for example, a doped well or a doped structure. In some example embodiments, the semiconductor substrate 11 may have various isolation structures, such as a shallow trench isolation (STI) structure. Also, the semiconductor substrate 11 may have a silicon-on-insulator (SOI) structure. The semiconductor substrate 11 may include a buried oxide (BOX) layer, which may be formed in, and in some embodiments to fill, a trench formed in a bulk silicon substrate with an oxide. The photodiode 100 including the BOX layer will be described in detail with reference to FIGS. 7 to 12B.

In some example embodiments, in addition to the photodiode 100, a plurality of individual devices of various types may be formed on the semiconductor substrate 11. The plurality of individual devices may include various microelectronic devices, for example, a metal-oxide-semiconductor field-effect transistor (MOSFET), a system large-scale integration (system LSI), an image sensor such as a complementary metal-oxide-semiconductor (CMOS) imaging sensor (CIS), a micro-electro-mechanical system (MEMS), an active device, and/or a passive device.

The crystalline layer 13-1 may be formed on the semiconductor substrate 11. The crystalline layer 13-1 may include crystalline silicon. The crystalline layer 13-1 may be single crystalline and/or polycrystalline. The crystalline layer 13-1 may be formed by depositing amorphous silicon (a-Si) on the semiconductor substrate 11 and crystallizing the deposited a-Si using an annealing process. Other techniques may be used, such as epitaxial deposition techniques. In some example embodiments, the crystalline layer 13-1 may include a single semiconductor element, such as Ge, or a semiconductor compound, such as SiC, GaAs, InAs, and InP.

An insulating pattern layer 15-1 may be formed on the crystalline layer 13-1 to define a plurality of holes H1 exposing a top surface of the crystalline layer 13-1. The plurality of holes H1 may have a plurality of island shapes separated from one another. The island shapes may be circular, elliptical and/or polygonal. The plurality of holes H1 may be formed in the insulating pattern layer 15-1 in a matrix shape having 15 rows and 6 columns. At least two holes H1 may be formed in the insulating pattern layer 15-1 and disposed in various shapes. The insulating pattern layer 15-1 may include oxide, nitride, or a combination thereof, for example, SiON and/or SiN.

The seed layer 17-1 may be formed within the plurality of holes H1 and connect the crystalline layer 13-1 and the light absorption layer 19. The seed layer 17-1 may be formed within the plurality of holes H1 by using an epitaxial growth process. The seed layer 17-1 may include germanium, silicon, or a combination thereof and be single crystalline or polycrystalline. A material forming the crystalline layer 13-1 may be different from a material forming the seed layer 17-1. In this case, a threading dislocation TD may be formed in the seed layer 17-1 due to a difference in lattice constant between the materials. The threading dislocation TD will be described with reference to FIG. 3.

Figure 3:
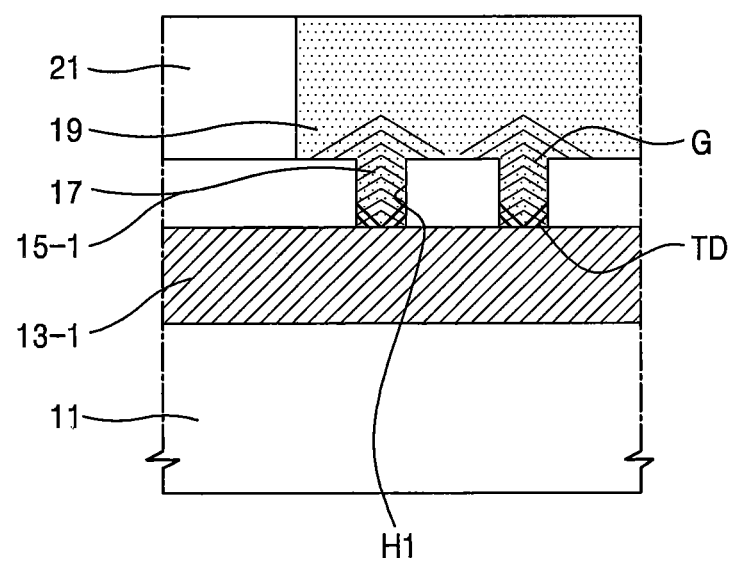
FIG. 3 is a detailed cross-sectional view of a portion P1 of FIG. 2A.

FIG. 3 is a detailed cross-sectional view of a portion P1 of FIG. 2A.

Referring to FIG. 3, a crystalline layer 13-1 may be formed on the semiconductor substrate 11, and an insulating pattern layer 15-1 may be formed on the crystalline layer 13-1 to define a seed layer 17-1. The crystalline layer 13-1 may be formed of a different material from the seed layer 17-1 formed on the crystalline layer 13. In this case, a threading dislocation TD may occur at an interface between the crystalline layer 13 and the seed layer 17-1 due to a difference in lattice constant between materials forming the crystalline layer 13-1 and the seed layer 17-1.

Specifically, the crystalline layer 13-1 of the photodiode 100 may be formed of silicon, and the seed layer 17-1 may be formed of germanium. In this case, although both silicon and germanium are Group IV elements, since germanium has an about 4% higher lattice constant than silicon, some atoms of the crystalline layer 13-1 may not correspond to atoms of the seed layer 17-1 so that a misfit dislocation may occur in the seed layer 17-1. The misfit dislocation may continuously occur with the growth of the seed layer 17-1. The misfit dislocation may continuously occur in a direction in which the seed layer 17-1 is grown, and evolve into a threading dislocation TD.

When a plurality of threading dislocations TD occur in the light absorption layer 19, a leakage current and a dark current may increase in the light absorption layer 19, and impurities may unnecessarily diffuse. As a result, a junction capacitance may increase, and responsivity of detection of a light signal may be reduced. Accordingly, a method for reducing a threading dislocation density (TDD) in the light absorption layer 19 may be desired. In general, to reduce the TDD in the light absorption layer 19, a method of forming the light absorption layer 19 by sequentially performing a low-temperature deposition process and a high-temperature deposition process, a method of performing a subsequent annealing process, and a method of forming a buffer layer under the light absorption layer 19 may be used. However, these methods may lead to unnecessary diffusion of impurities or generation of a dark current due to a reduction in bandgap energy.

According to the inventive concepts, the insulating pattern layer 13-1 defining a plurality of holes H1 may be formed between the crystalline layer 13-1 and the light absorption layer 19. The light absorption layer 19 capable of reducing the threading dislocation (TD) defects may be formed by forming the seed layer 17-1 within the plurality of holes H1. The seed layer 17-1 may be epitaxially grown from the plurality of holes H1 formed in the insulating pattern layer 15-1. In this case, a direction in which the seed layer 17-1 is grown may be inclined under the influence of an inner wall of the hole H1. In other words, the direction in which the seed layer 17-1 is grown may not be perpendicular to a top surface of the crystalline layer 13 but inclined toward edges of the hole H. As a result, a single layer G formed by growing the seed layer 17-1 may have a mountain shape.

In this case, since the direction in which the seed layer 17-1 is grown is inclined toward the edges of the hole H1, the threading dislocation TD also may be inclined toward the edges of the hole H1. Thus, the threading dislocation TD formed from an interface between the crystalline layer 13-1 and the seed layer 17-1 may be cut off by the inner wall of the hole H1. Thus, even if the light absorption layer 19 is continuously formed from the seed layer 17-1, the threading dislocations TD may not occur in the light absorption layer 19. As a result, a light absorption layer 19 having high photoelectric conversion efficiency may be obtained. Also, since the seed layer 17-1 is grown in each of the plurality of holes H1, the light absorption layer 19 having high photoelectric conversion efficiency may be formed rapidly and uniformly formed over the entire top surface of the insulating pattern layer 15-1, including the seed layer 17-1 grown in each of the holes H1.

As described above, the epitaxial growth process for forming the seed layer 17-1 may be performed to cover a top surface of the insulating pattern layer 15-1 even if the holes H1 are filled with the seed layer 17-1. As a result, the light absorption layer 19 that is formed of the same material as the seed layer 17-1 and having lower density of TD defects, and in some embodiments free from TD defects, may be formed on the seed layer 17-1 and the insulating pattern layer 15-1. Since the light absorption layer 19 is continuously grown from the seed layer 17-1 that is grown from the holes H, the light absorption layer 19 may be formed by lateral epitaxial growth such that a direction in which a material forming the light absorption layer 19 is grown is inclined toward the edges of the holes H1.

Accordingly, FIGS. 1-3 also illustrate example embodiments of a photodiode 100 that includes a substrate 11, a seed layer 17-1 that comprises a plurality of crystalline seeds that are spaced apart from one another, on the substrate 11, and a light absorption layer 19 directly on the seed layer 17-1, and providing a unitary crystalline structure with the seed layer 17-1, wherein the light absorption layer 19 has lower threading dislocation density (TDD) than the seed layer 17-1. A crystalline layer 13-1 may also be provided on the seed layer 17-1 opposite the light absorption layer 19.

Referring back to FIGS. 2A and 2B, a light absorption layer 19 may be formed on the seed layer 17-1 and the insulating pattern layer 15-1. The light absorption layer 19 may absorb external light L and convert the external light L into an electric signal. The electric signal may be externally output through a contact plug 25A formed on the light absorption layer 19 and an electrode 27A connected to the contact plug 25A or through a contact plug 25B formed on the crystalline layer 13-1 and an electrode 27B formed on the contact plug 25B. In some example embodiments, when the seed layer 17-1 is formed using an epitaxial growth process, the light absorption layer 19 may be grown from the seed layer 17-1 due to lateral epitaxial growth. The lateral epitaxial growth of the light absorption layer 19 may occur under the influence of a direction in which the seed layer 17-1 is epitaxially grown, as described above with reference to FIG. 3. In some example embodiments, the light absorption layer 19 may be a single layer or a multilayered structure. That is, the light absorption layer 19 may have a multilayered structure formed by sequentially performing a low-temperature deposition process and a high-temperature deposition process. For example, the light absorption layer 19 may include a low-temperature germanium deposition layer and a germanium high-temperature deposition layer that are stacked sequentially. The light absorption layer 19 may include germanium, silicon, or a combination thereof and be single crystalline or polycrystalline. In some example embodiments, the light absorption layer 19 may have a greater thickness than thicknesses of the insulating pattern layer 15-1 and the seed layer 17-1 as described with reference to FIG. 4.

Figure 4:
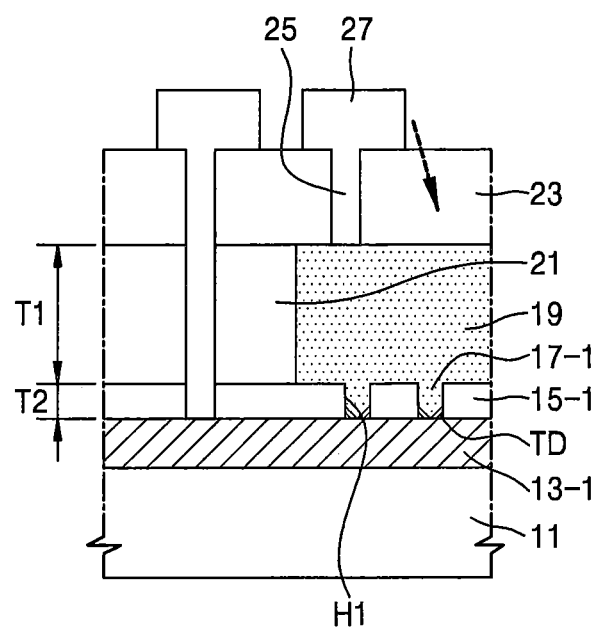
FIG. 4 is a detailed cross-sectional view of a portion P2 of FIG. 2A.

FIG. 4 is a detailed cross-sectional view of a portion P2 of FIG. 2A.

Referring to FIG. 4, a first thickness T1 of the light absorption layer 19 may be greater than a second thickness T2 of the insulating pattern layer 15-1 and the seed layer 17-1. Since defects, such as threading dislocations TD, occur in the seed layer 17-1 as described with reference to FIG. 3, even if the seed layer 17-1 absorbs light, problems, such as generation of a dark current, may be caused. In particular, when the seed layer 17-1 and the light absorption layer 19 comprise the same material, the seed layer 17-1 may absorb light more briskly, so that current loss may increase and responsivity of the photodiode 100 may be degraded. Accordingly, by increasing the first thickness T1 of the light absorption layer 19 more than the second thickness T2 of the seed layer 17-1, absorption of light into the light absorption layer 19 may be promoted, and absorption of light into the seed layer 17-1 may be reduced or inhibited. Thus, photoelectric conversion efficiency of the photodiode 100 may be elevated.

Referring back to FIGS. 2A and 2B, a first insulating layer 21 defining the light absorption layer 19 may be formed on the insulating pattern layer 15-1. The first insulating layer 21 may include an oxide, a nitride, or a combination thereof, for example, SiON and/or SiN.

A second insulating layer 23 may be formed on the light absorption layer 19 and the first insulating layer 21. Since the second insulating layer 23 has to transmit external light L, the second insulating layer 23 may be a transmissive material layer having an insulating characteristic and transmittance. In some example embodiments, the second insulating layer 23 may include oxide, nitride, or a combination thereof, for example, SiON and/or SiN. In some example embodiments, the insulating pattern layer 15-1, the first insulating layer 21, and the second insulating layer 23 may be formed of the same material, but the inventive concepts are not limited thereto.

A contact plug 25A may be formed on and connected to the light absorption layer 19 and configured to receive an electric signal generated by the light absorption layer 19. The contact plug 25A may be connected to an electrode 27A on the second insulating layer 23 and externally output the electric signal. The contact plug 25B may be formed on and connected to the crystalline layer 13-1. The electric signal generated by the light absorption layer 19 may be transmitted through the seed layer 17-1 to the crystalline layer 13-1, transmitted through the contact plug 25B connected to the crystalline layer 13-1, and externally output.

Figure 5:
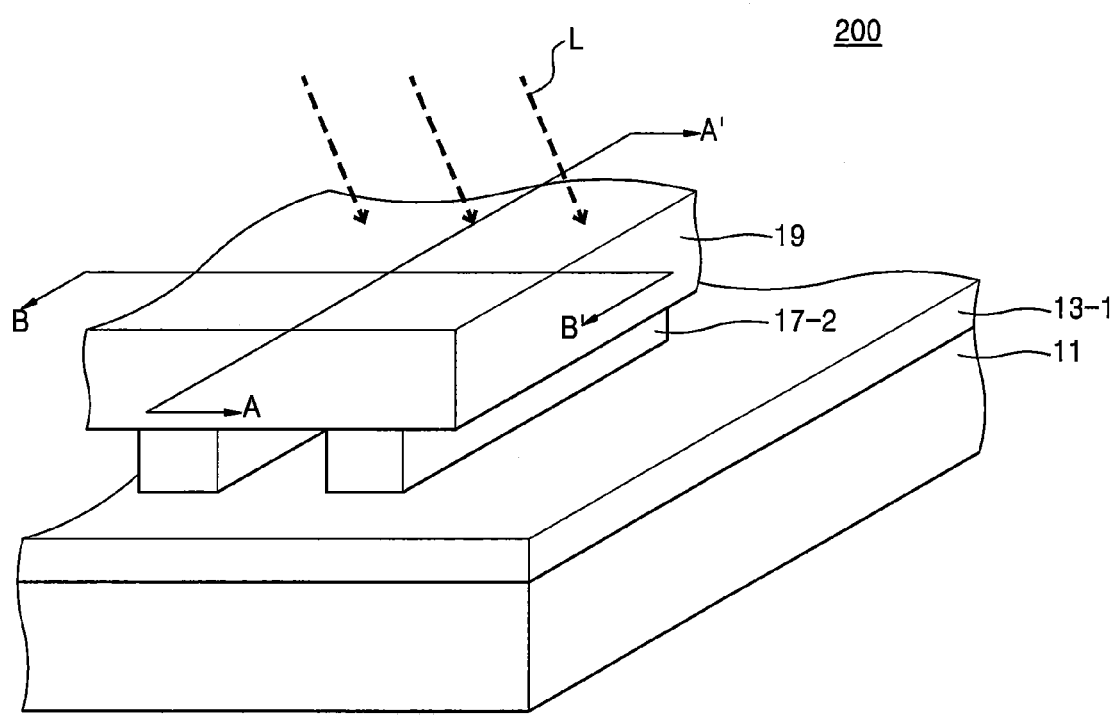
FIG. 5 is a diagram of a schematic structure of a photodiode according to an example embodiment.

FIG. 5 is a schematic diagram of a structure of a photodiode 200 according to an example embodiment. Although the photodiode 200 shown in FIG. 5 is similar to the photodiode 100 shown in FIG. 1, the seed layer 17-2 may have a plurality of line shapes.

Referring to FIG. 5, the photodiode 200 may include a semiconductor substrate 11, a crystalline layer 13-1 on the semiconductor substrate 11, a seed layer 17-2 directly on the crystalline layer 13-1 and including a plurality of line shapes, and a light absorption layer 19 directly on the seed layer 17-2. The line shape may have four or more sides.

As described above, external light L may be absorbed into a top surface of the light absorption layer 19. The external light L that is directly absorbed into the light absorption layer 19 may be converted into an electric signal in the light absorption layer 19, and the electric signal may be transmitted through the seed layer 17-2 having the plurality of line shapes and the crystalline layer 13-1.

Figure 6A:
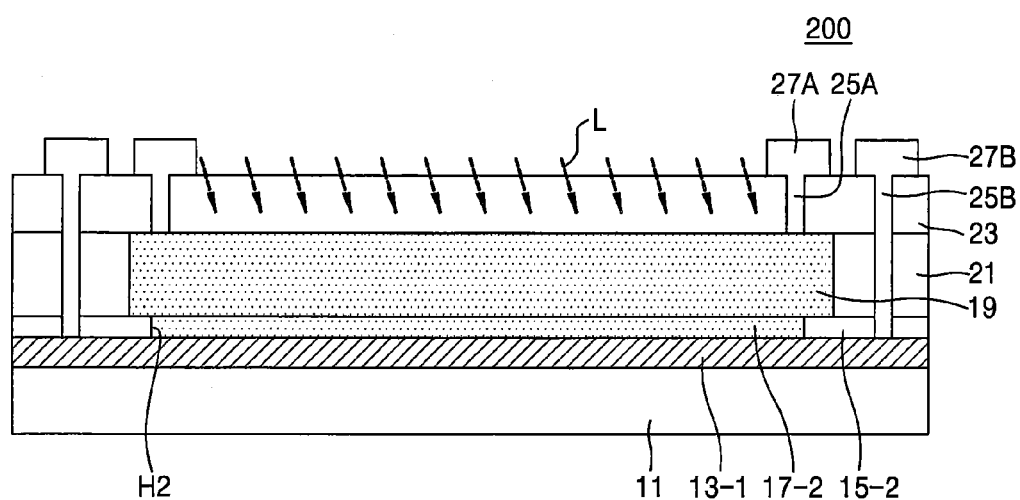
FIGS. 6A and 6B are cross-sectional views of a photodiode according to an example embodiment.
Figure 6B:
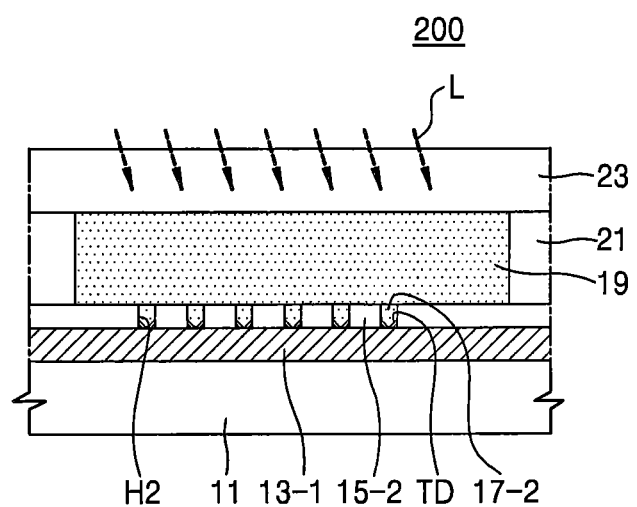

FIGS. 6A and 6B are cross-sectional views of the photodiode 200 of FIG. 5, according to an example embodiment. FIG. 6A is a cross-sectional view taken along a direction A-A' of FIG. 5, which illustrates the photodiode 200 in a wider range than in FIG. 5. FIG. 6B is a cross-sectional view taken along a direction B-B' of FIG. 5, which illustrates the photodiode 200 in a wider range than in FIG. 5.

Referring to FIGS. 6A and 6B, a crystalline layer 13-1 may be formed on a semiconductor substrate 11. An insulating pattern layer 15-2 may be formed on the crystalline layer 13-1 to expose a top surface of the crystalline layer 13-1 and define a plurality of holes H1. The plurality of holes H1 may be a plurality of line-shaped holes. The plurality of line-shaped holes H1 may be spaced apart from one another. The plurality of line-shaped holes H1 formed in the insulating pattern layer 15-2 may be arranged in six columns, but the inventive concepts are not limited thereto. In some example embodiments, the plurality of holes H1 formed in the insulating pattern layer 15-2 may be arranged in at least two lines. In some example embodiments, the plurality of holes H1 formed in the insulating pattern layer 15-2 may be a combination of line-shaped holes and island-shaped holes.

A seed layer 17-2 may be formed within the plurality of line-shaped holes H1 and connect the crystalline layer 13-1 and a light absorption layer 19. The seed layer 17-2 may be epitaxially grown within the plurality of line-shaped holes H1. Thus, the seed layer 17-2 may have line-shaped structures arranged in six columns. When a material forming the crystalline layer 13-1 is different from a material forming the seed layer 17-2, a threading dislocation may be formed in the line-shaped seed layer 17-2. However, under the influence of an inner wall of the hole H1, the seed layer 17-2 may not grow in a parallel direction to the top surface of the crystalline layer 13-1, but be inclined toward two edges of the line-shaped hole H1. As a result, the threading dislocation TD also may be inclined toward the two edges of the line-shaped hole H1. Thus, the threading dislocation TD also formed from an interface between the crystalline layer 13-1 and the seed layer 17-2 may be cut off by the inner wall of the line-shaped hole H1. Thus, even if the light absorption layer 19 is continuously formed from the seed layer 17-2, a threading dislocation may not occur in the light absorption layer 19. As a result, a light absorption layer 19 having high photoelectric conversion efficiency may be obtained. Also, since the seed layer 17-2 is grown from each of the plurality of holes H1, the light absorption layer 19 having high photoelectric conversion efficiency may be formed rapidly and uniformly formed over the entire surface of the semiconductor substrate 11.

A light absorption layer 19 may be formed on the seed layer 17-2, and external light L may be absorbed into the light absorption layer 19 to generate an electric signal. The electric signal may be externally output through contact plugs 25A and 25B, which are respectively formed on the light absorption layer 19 and the crystalline layer 13-1, and electrodes 27A and 27B respectively connected to the contact plugs 25A and 25B.

Figure 7:
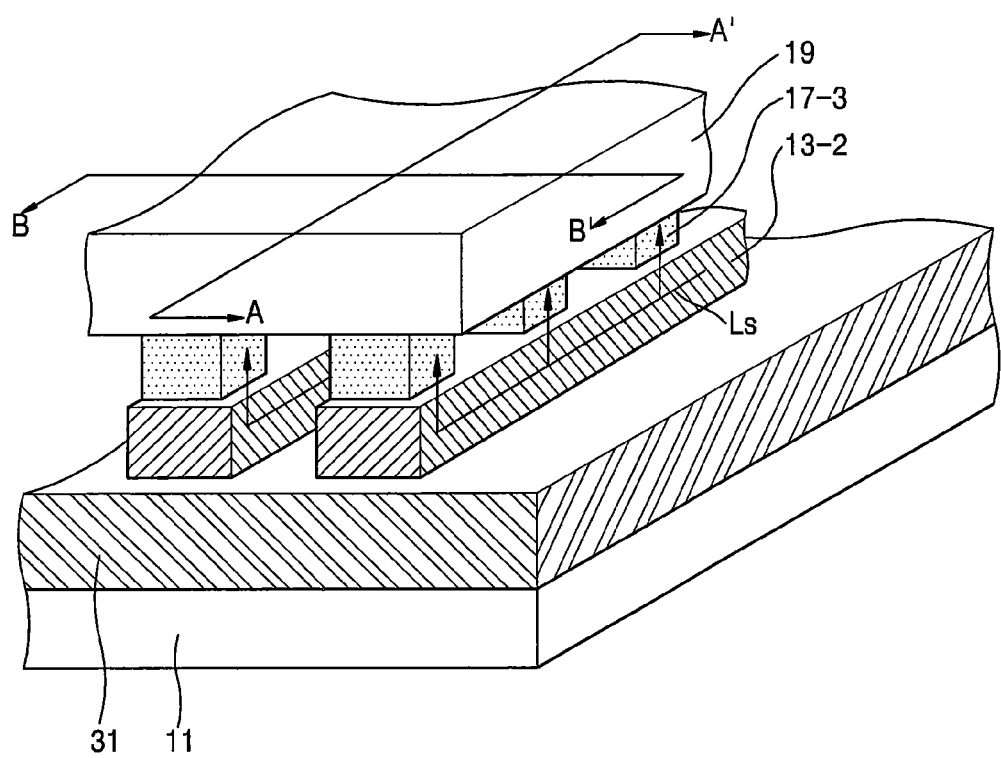
FIG. 7 is a diagram of a schematic structure of a photodiode according to an example embodiment.
Figure 8A:
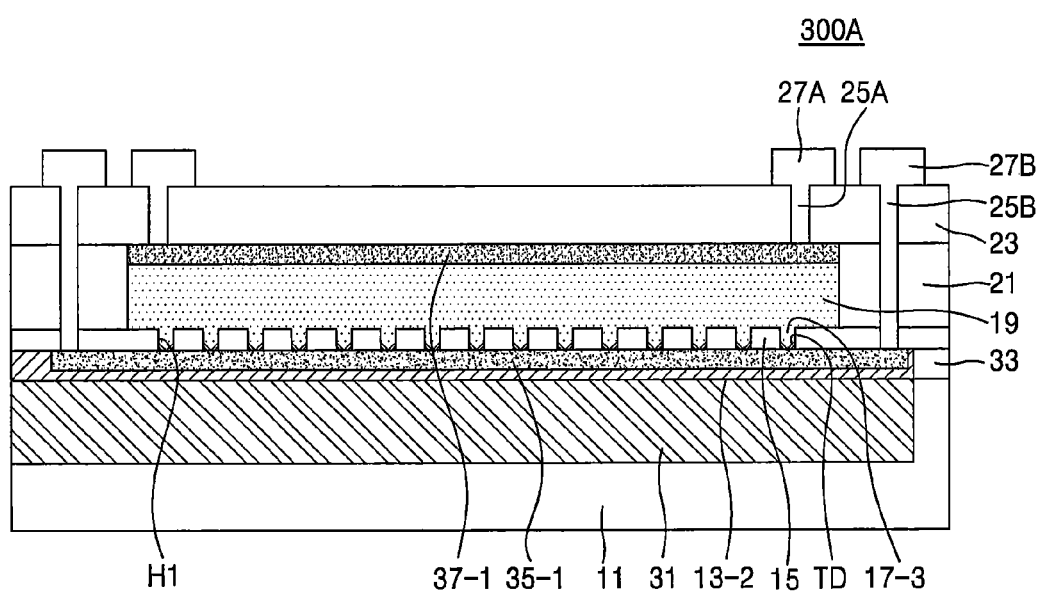
FIGS. 8A and 8B are cross-sectional views of a photodiode according to an example embodiment.
Figure 8B:
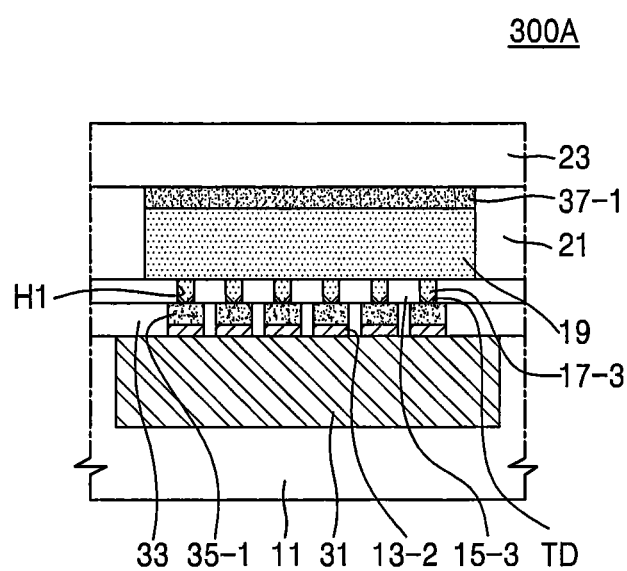
Figure 9A:
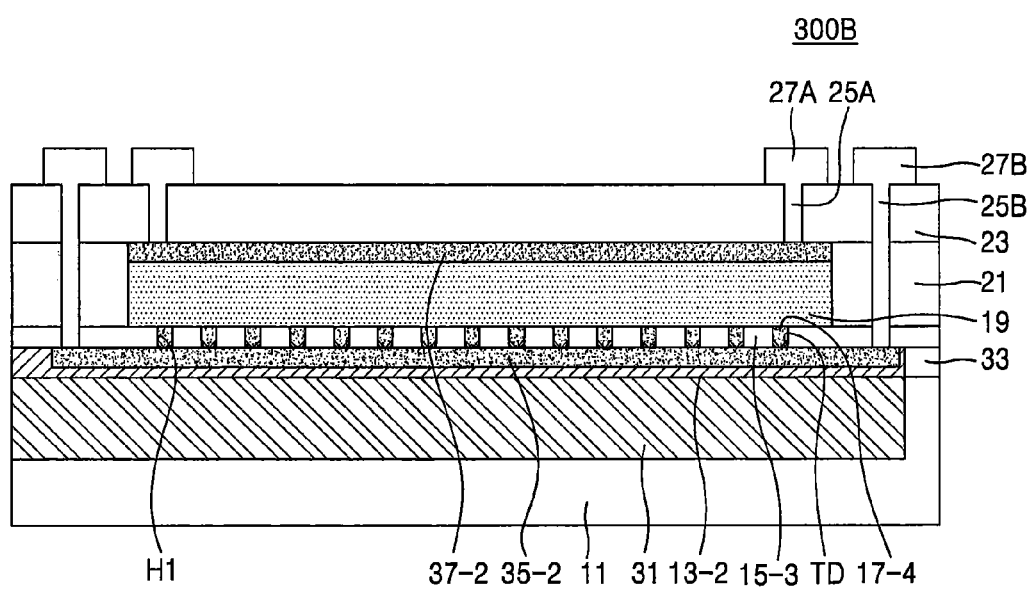
FIGS. 9A and 9B are cross-sectional view of a photodiode according to an example embodiment.
Figure 9B:
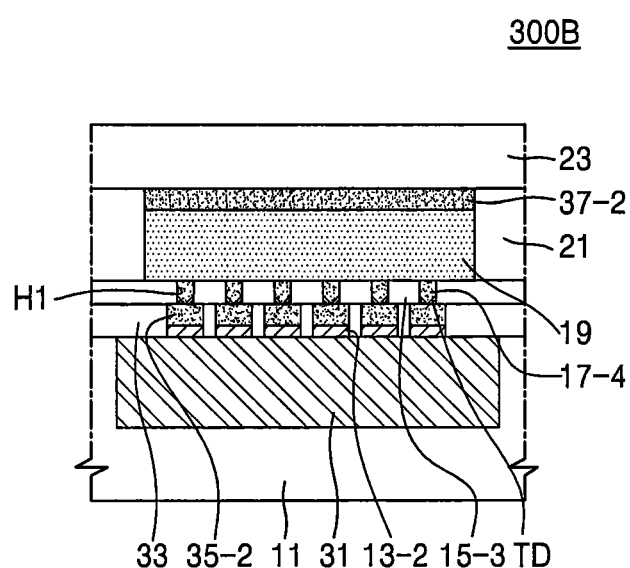

FIG. 7 is a schematic diagram of a structure of a photodiode 300 according to an example embodiment. The photodiode 300 shown in FIG. 7 is similar to the photodiodes 100 and 200 shown in FIGS. 1 and 5 except that a semiconductor substrate 11 includes a buried insulating layer 31 and a crystalline layer 13-2 is etched as a line type. Thus, although the photodiode 300 may absorb external light like the photodiodes 100 and 200, the photodiode 300 may absorb a light signal Ls transmitted from the crystalline layer 13-2. FIGS. 8A, 9A, and 10B are cross-sectional views taken along a direction A-A' of FIG. 7, which illustrate the photodiode 300 in a wider range than in FIG. 7. FIGS. 8B, 9B, and 10B are cross-sectional views taken along a direction B-B' of FIG. 7, which illustrate the photodiode 300 in a wider range than in FIG. 7.

Referring to FIG. 7, the photodiode 300 may include a semiconductor substrate 11, a buried insulating layer 31 in the semiconductor substrate 11, a line-shaped crystalline layer 13-2 on the buried insulating layer 31, a seed layer 17-3 directly on the line-shaped crystalline layer 13-2 and including a plurality of structures, and a light absorption layer 19 directly on the seed layer 17-3.

The line-shaped crystalline layer 13-2 may correspond to a waveguide. Thus, a light signal Ls may be transmitted through the crystalline layer 13-2. A refractive index of the buried insulating layer 31 may be lower than a refractive index of the crystalline layer 13-2. Accordingly, even if a bottom surface of the crystalline layer 13-2 is in contact with the buried insulating layer 31, the light signal Ls may be totally reflected and travel in the crystalline layer 13-2, rather than being lost due to the buried insulating layer 31. The light signal Ls, which may travel in the crystalline layer 13-2 in a horizontal direction, may be transmitted through the seed layer 17-3 connected to the crystalline layer 13-2, and reach and be absorbed in the light absorption layer 19 in a direction perpendicular to the light absorption layer 19. The crystalline layer 13-2 may include at least one line. When the crystalline layer 13-2 includes a plurality of lines, the light signal Ls may be transmitted through each of the plurality of lines.

The seed layer 17-3 may be formed on the line-shaped crystalline layer 13-2. The plurality of structures included in the seed layer 17-3 may be pillar-type structures that are spaced apart from one another. A width of each of the pillar-type structures of the seed layer 17-3 may be equal to or less than a width of each of the lines of the crystalline layer 13-2.

The light absorption layer 19 may be formed on the seed layer 17-3. The light signal Ls transmitted along the crystalline layer 13-2 in a horizontal direction may be transmitted along the seed layer 17-3 in a direction perpendicular to the light absorption layer 19.

The light signal Ls transmitted to the light absorption layer 19 may be converted into an electric signal in the light absorption layer 19. The electric signal may be externally output through an electrode (not shown) connected to the light absorption layer 19 or an electrode (not shown) connected to the crystalline layer 13-2.

FIGS. 8A and 8B are cross-sectional views of a photodiode 300A according to an example embodiment.

Referring to FIGS. 8A and 8B, a semiconductor substrate 11 may include a trench. The trench may include therein, and in some embodiments be filled with, an insulating material to form a buried insulating layer 31 in the semiconductor substrate 11. In some example embodiments, the buried insulating layer 31 may include an oxide, a nitride, or a combination thereof, for example, SiON and/or SiN. In some example embodiments, the buried insulating layer 31 may be formed of a material having a lower refractive index than a refractive index of a crystalline layer 13-2. A structure in which the buried insulating layer 31 is formed by forming the trench in the semiconductor substrate 11 may be similar to a silicon-on-insulator (SOI) substrate structure in which an oxide layer is formed on a silicon substrate and single-crystalline silicon is formed on the oxide layer. However, in the structure according to the present inventive concepts in which the trench is formed only in a portion of the semiconductor substrate 11 and the buried insulating layer 31 is formed within the trench may reduce costs compared to the SOI substrate structure in which the oxide layer should be formed over the entire surface of the substrate. Referring to FIG. 8B, the buried insulating layer 31 may be formed only under a position in which the crystalline layer 13-2 is formed.

The crystalline layer 13-2 having six lines may be formed on the buried insulating layer 31. The crystalline layer 13-2 having six lines may be defined by an insulating layer 33. A seed layer 17-3 including a plurality of pillar-type structures may be formed on the crystalline layer 13-2 including the six lines, and the seed layer 17-3 may be defined by an insulating patter layer 15-3. Accordingly, the six lines of the crystalline layer 13-2 may be isolated from one another by the buried insulating layer 31, the insulating layer 33, and the insulating pattern layer 15-3. In this case, a refractive index of each of the buried insulating layer 31, the insulating layer 33, and the insulating pattern layer 15-3 may be lower than a refractive index of the crystalline layer 13-2. Thus, total reflection of a light signal Ls may easily occur in the crystalline layer 13-2 without significant loss of light. FIG. 8A illustrates an example embodiment in which the crystalline layer 13-2 includes six lines, but the inventive concepts are not limited thereto. In another example embodiment, the crystalline layer 13-2 may include one line or at least three lines.

A first region 35-1 including a first semiconductor material layer may be formed on a top surface of the crystalline layer 13-2. Thus, the seed layer 17-3 may be formed directly on the first region 35-1. Also, a second region 37-1 including a second semiconductor material layer having different electrical properties from the first semiconductor material layer may be formed on a top surface of a light absorption layer 19. In this case, an electric signal generated by the light absorption layer 19 may be transmitted in a perpendicular direction through a path between the first region 35-1 and the second region 37-1. In some example embodiments, the first semiconductor material layer may include an n-type semiconductor material, and the second semiconductor material layer may include a p-type semiconductor material, but, the inventive concepts are not limited thereto. In another example embodiment, the first semiconductor material layer may include a p-type semiconductor material, and the second semiconductor material layer may include an n-type semiconductor material. In this case, the first region 35-1, the second region 37-1, and the light absorption layer 19 between the first region 35-1 and the second region 37-1 may constitute a vertical P-I-N diode. The light absorption layer 19 between the first region 35-1 and the second region 37-1 may be functioned as an intrinsic region in the P-I-N diode. The intrinsic region make the photodiode 300A have more fast switches features.

The first region 35-1 may be electrically connected to an electrode 27B by a contact plug 25B, and the second region 37-1 may be electrically connected to an electrode 27A by a contact plug 25A. The electrodes 27A and 27B may externally output the electric signal.

FIGS. 9A and 9B are cross-sectional views of a photodiode 300B according to an example embodiment. The photodiode 300B shown in FIGS. 9A and 9B is similar to the photodiode 300A shown in FIGS. 8A and 8B except that a seed layer 17-4 may include a third semiconductor material layer formed of the same material as a first semiconductor layer included in a first region 35-1.

Referring to FIGS. 9A and 9B, the top surface of the crystalline layer 13-2 and the seed layer 17-4 connected to the top surface of the crystalline layer 13-2 may include the third semiconductor material layer, which may be formed of the same material as the first semiconductor material layer included in the first region 35-1 shown in FIGS. 8A and 8B. Thus, the first region 35-1 shown in FIGS. 8A and 8B and the third semiconductor material layer may constitute a third region 35-2. In some example embodiments, the first semiconductor material layer may be unified with the third semiconductor material layer. In some example embodiments, a third semiconductor material may be doped into a top surface of the crystalline layer 13-2 and an annealing process may be performed so that the third region 35-2 may cover a range within which the third semiconductor material diffuses in the seed layer 17-4. In some example embodiments, the third semiconductor material layer may include an n-type semiconductor material, and the second semiconductor material layer may include a p-type semiconductor material, but the inventive concepts are not limited thereto. In another example embodiment, the third semiconductor material layer may include a p-type semiconductor material, and the second semiconductor material layer may include an n-type semiconductor material.

Since defects, such as threading dislocations TD, occur in the seed layer 17-4 as described above, even if the seed layer 17-4 absorbs light, problems, such as generation of a dark current, may be caused. In particular, when the seed layer 17-4 and the light absorption layer 19 are formed of the same material, the seed layer 17-4 may absorb light more briskly, so that current loss may increase and responsivity of the photodiode 300B may be degraded. Accordingly, by doping the seed layer 17-4 with impurities, absorption of light into the seed layer 17-4 may be reduced or inhibited, and absorption of light into the light absorption layer 19 may be promoted. Thus, photoelectric conversion efficiency of the photodiode 300B may be elevated.

Figure 10A:
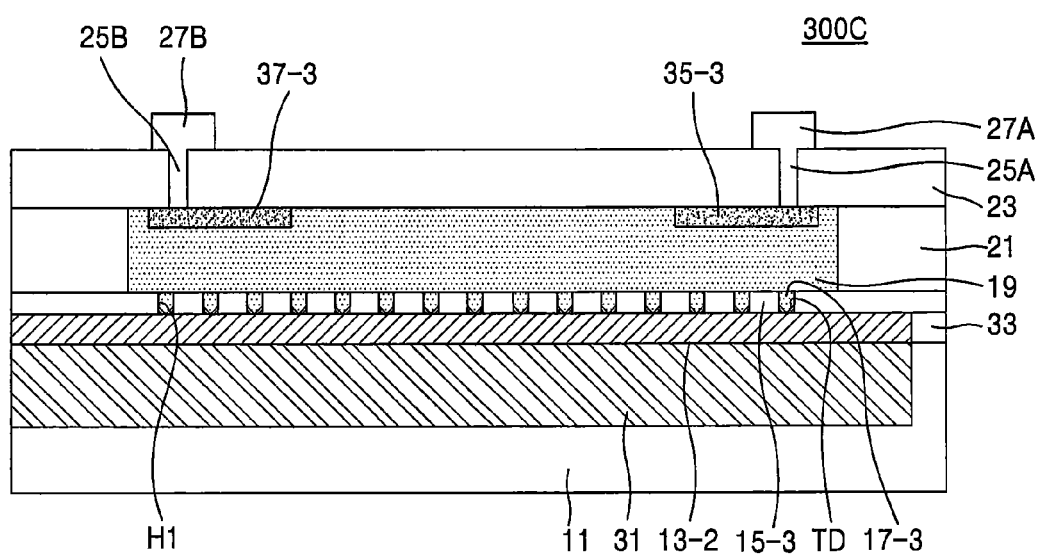
FIGS. 10A and 10B are cross-sectional views of a photodiode according to an example embodiment.
Figure 10B:
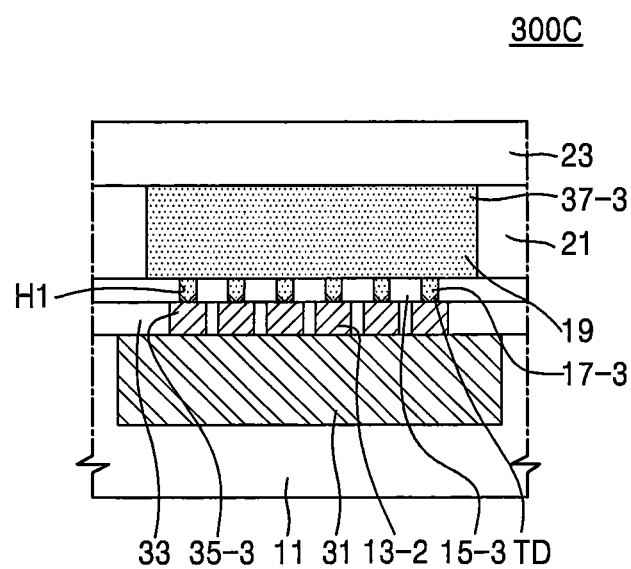

FIGS. 10A and 10B are cross-sectional views of a photodiode 300C according to an example embodiment. The photodiode 300C shown in FIGS. 10A and 10B is similar to the photodiode 300A shown in FIGS. 8A and 8B except for positions in which a first region 35-3 and a second region 37-3 are disposed.

Referring to FIGS. 10A and 10B, a first region 35-3 including a first semiconductor material layer may be formed on the light absorption layer 19, and a second region 35-3 including a second semiconductor material layer having different electrical properties from the first semiconductor material layer may be formed on the light absorption layer 19. In this case, an electric signal generated by the light absorption layer 19 may be transmitted in a horizontal direction through a path between the first region 35-3 and the second region 37-3. Since the path through which the electric signal is transmitted in the horizontal direction is short, responsivity of the photodiode 300C may be increased. Contact plugs 25A and 25B may be respectively connected to top surfaces of the first region 35-3 and the second region 37-3, and the electric signal may be externally output by electrodes 27A and 27B that are respectively connected to the contact plugs 25A and 25B. In some example embodiments, the first semiconductor material layer may include an n-type semiconductor material, and the second semiconductor material layer may include a p-type semiconductor material, but the inventive concepts are not limited thereto. In another example embodiment, the first semiconductor material layer may include a p-type semiconductor material, and the second semiconductor material layer may include an n-type semiconductor material. In this case, the first region 35-3, the second region 37-3, and the light absorption layer 19 between the first region 35-3 and the second region 37-3 may constitute a lateral P-I-N diode. The light absorption layer 19 between the first region 35-3 and the second region 37-3 may be functioned as an intrinsic region in the P-I-N diode.

Figure 11:
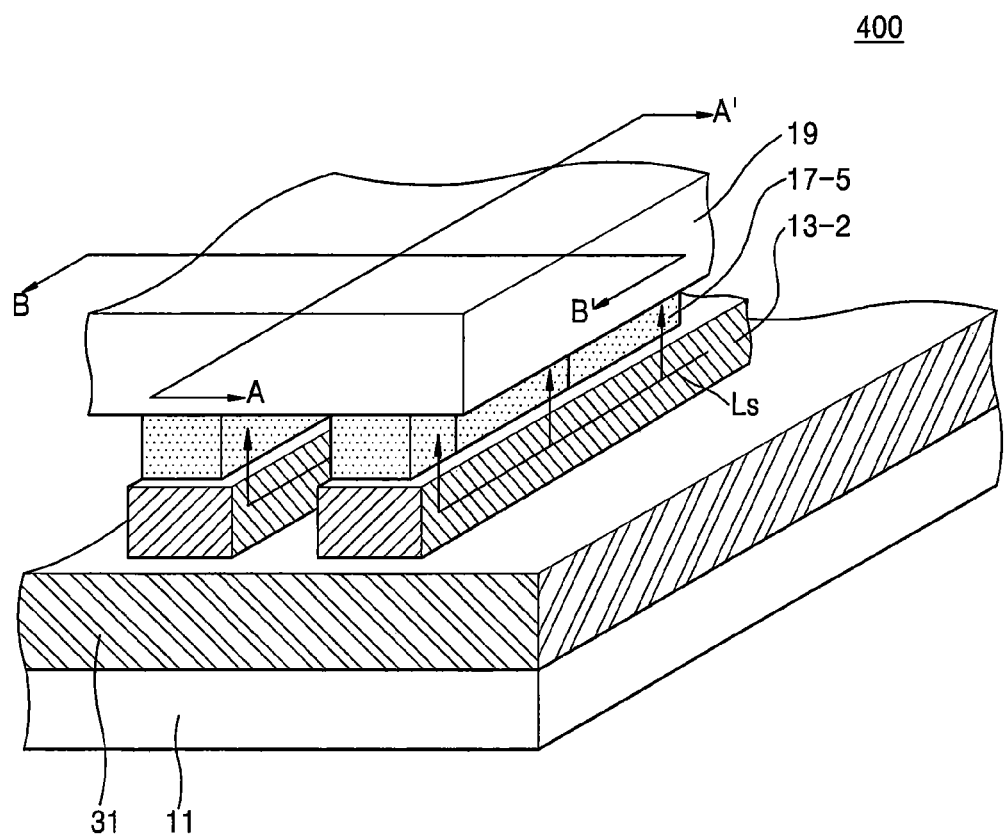
FIG. 11 is a diagram of a schematic structure of a photodiode according to an example embodiment.

FIG. 11 is a schematic diagram of a structure of a photodiode 400 according to an example embodiment. The photodiode 400 shown in FIG. 11 is similar to the photodiode 300 shown in FIG. 7 except that a seed layer 17-5 has a line shape.

Referring to FIG. 11, the photodiode 400 may include a semiconductor substrate 11, a buried insulating layer 31 formed in the semiconductor substrate 11, a line-shaped crystalline layer 13-2 formed on the buried insulating layer 31, a seed layer 17-5 formed on the crystalline layer 13-2 in a line shape to overlap the line-shaped crystalline layer 13-2, and a light absorption layer 19 formed on the seed layer 17-5.

The line-shaped crystalline layer 13-2 may correspond to a waveguide. Thus, a light signal Ls may be transmitted through the crystalline layer 13-2. The light signal Ls may be transmitted through each of a plurality of lines of the crystalline layer 13-2.

The line-shaped seed layer 17-5 may be formed on the line-shaped crystalline layer 13-2. A width of each of lines of the seed layer 17-5 may be equal to or less than a width of each of the lines of the crystalline layer 13-2. In other embodiments, the lines of the seed layer 17-5 and the lines of the crystalline layer 13-2 may have different numbers of sides.

A light absorption layer 19 may be formed on the line-shaped seed layer 17-5 and connected to the line-shaped seed layer 17-3.

Figure 12A:
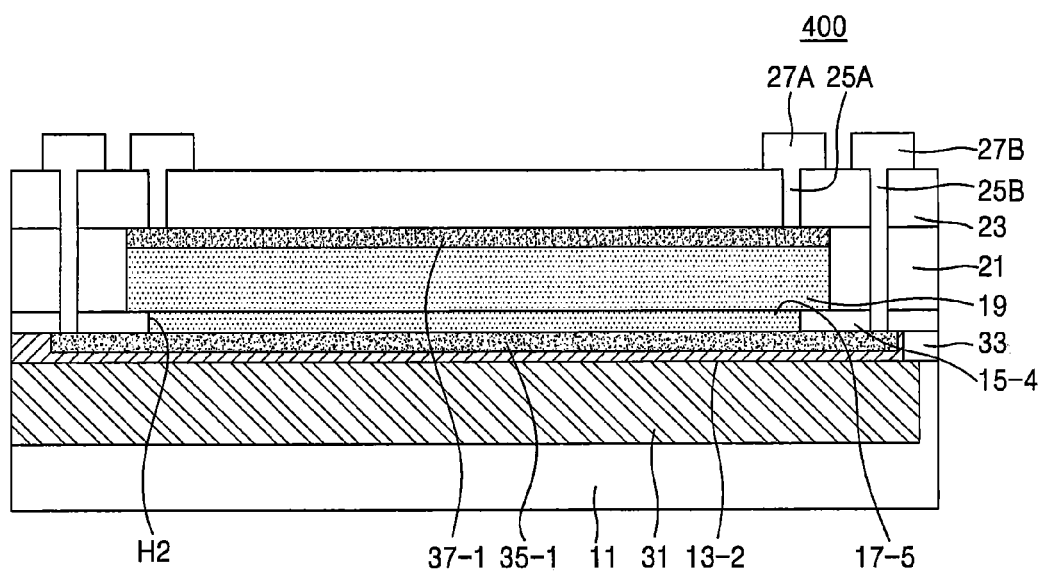
FIGS. 12A and 12B are cross-sectional views of a photodiode according to an example embodiment.
Figure 12B:
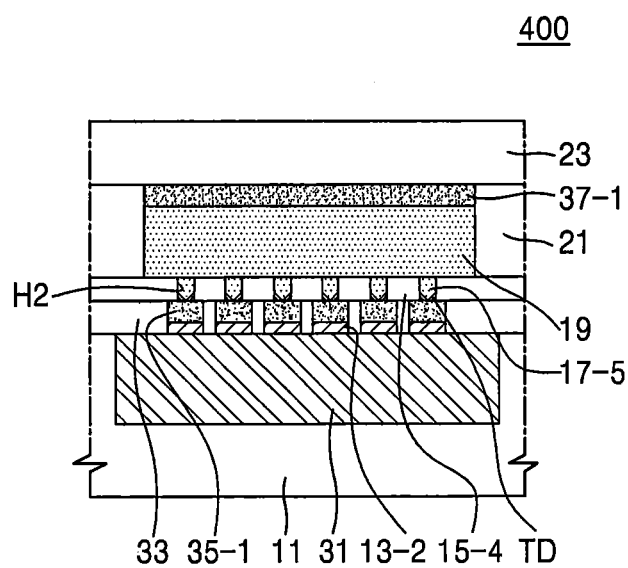

FIGS. 12A and 12B are cross-sectional views of the photodiode 400 of FIG. 11, according to an example embodiment. FIG. 12A is a cross-sectional view taken along a direction A-A' of FIG. 11, which illustrates the photodiode 400 in a wider range than in FIG. 11. FIG. 12B is a cross-sectional view taken along a direction B-B' of FIG. 11, which illustrates the photodiode 400 in a wider range than in FIG. 11.

Referring to FIGS. 12A and 12B, a line-shaped crystalline layer 13-2 configured to transmit light may be formed on a buried insulating layer 31 formed in a semiconductor substrate 11. An insulating pattern layer 15-4 may be formed on the line-shaped crystalline layer 13-2 and define line-shaped holes exposing a top surface of the line-shaped crystalline layer 13-2. Thus, the insulating pattern layer 15-4 may be formed to define six line-shaped holes H2.

A seed layer 17-5 may be formed within the six line-shaped holes H2 and connect the crystalline layer 13-2 and the light absorption layer 19. When a material forming the crystalline layer 13-2 is different from a material forming the seed layer 17-5, a threading dislocation TD may be formed in the line-shaped seed layer 17-5. However, since the threading dislocation TD is inclined toward two edges of the line-shaped hole H2 under the influence of an inner wall of the hole H2, the threading dislocation TD formed within the seed layer 17-5 may be cut off by the inner wall of the line-shaped hole H2. As a result, the light absorption layer 19 may include high-quality crystals. Also, since the light absorption layer 19 is simultaneously grown from the seed layer 17-5 formed in the respective line-shaped holes H, the light absorption layer 19 having high photoelectric conversion efficiency may be formed rapidly and uniformly formed over the entire surface of the semiconductor substrate 11.

A first region 35-1 including a first semiconductor material layer may be formed on the top surface of the line-shaped crystalline layer 13-2. A second region 37-1 including a second semiconductor material layer having different electrical properties from the first semiconductor material layer may be formed on a top surface of the light absorption layer 19. The first region 35-1 and the second region 37-1 may be respectively connected to electrodes 27B and 27A by contact plugs 25B and 25A, and an electric signal may be externally output through the electrodes 27B and 27A.

FIGS. 12A and 12B illustrate an example embodiment in which the photodiode 400 includes vertical electrodes, but the inventive concepts are not limited thereto. For example, the photodiode 400 may have a horizontal electrode structure by forming a first region and a second region on the top surface of the light absorption layer 19.

Figure 13:
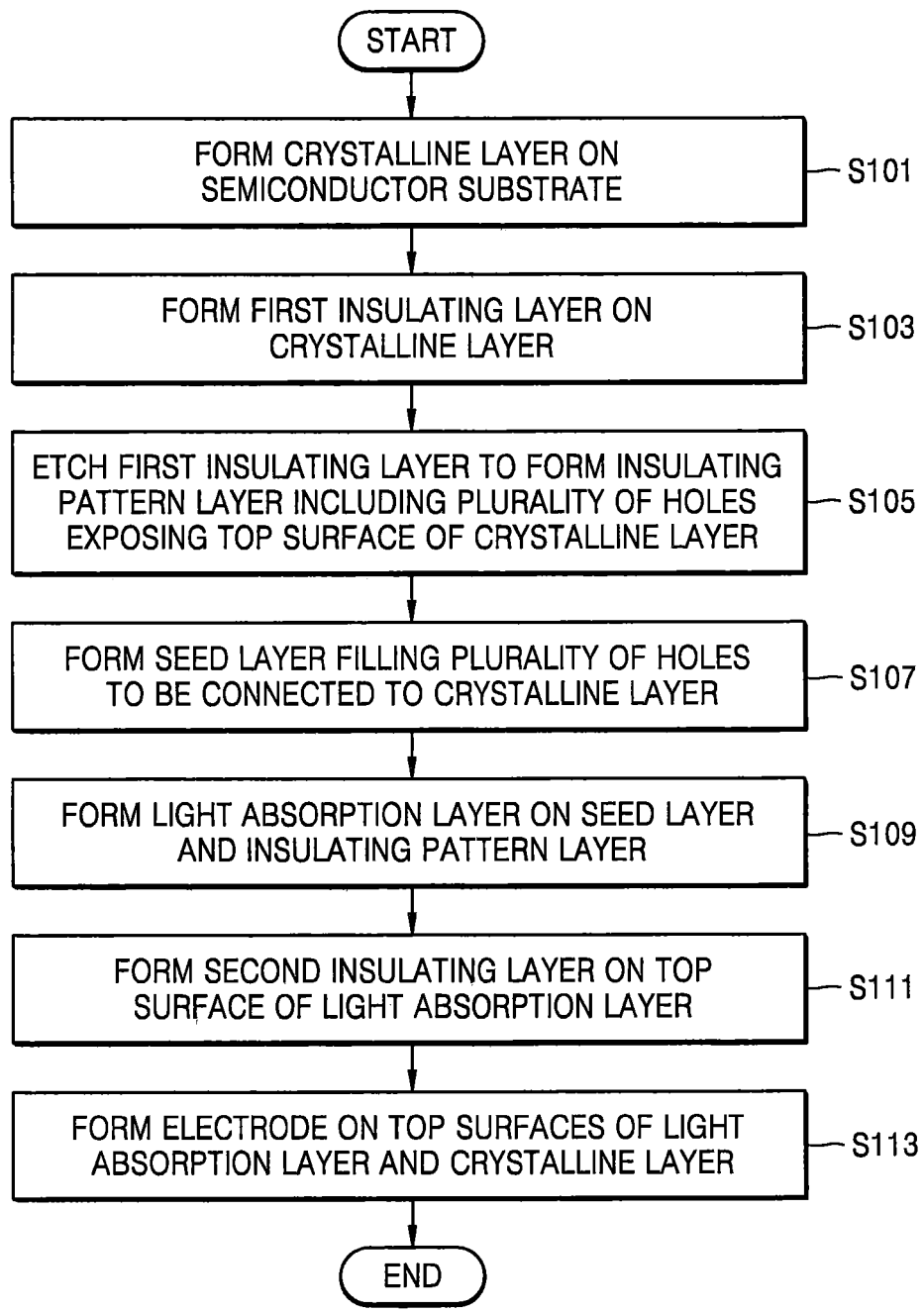
FIG. 13 is a flowchart illustrating a method of manufacturing the photodiodes, according to an example embodiment.

FIG. 13 is a flowchart of a method of manufacturing the photodiode 100 and 200 of FIGS. 1 and 5, according to an example embodiment.

Referring to FIGS. 1 to 6B and 13, a crystalline layer 13-1 may be formed on a semiconductor substrate 11 (S101). The crystalline layer 13-1 may be formed by using an epitaxial growth process. A first insulating layer may be formed on the crystalline layer 13-1 (S103), and portions of the first insulating layer may be etched to form an insulating pattern layer 15-1 or 15-2 including a plurality of holes H1 exposing a top surface of the crystalline layer 13-1 (S105). In this case, the plurality of holes H1 may have a plurality of island shapes and/or a plurality of line shapes that are spaced apart from one another. A seed layer 17-1 or 17-2 may be formed to fill the plurality of holes H1 and connected to the crystalline layer 13-1 (S107). After the seed layer 17-1 or 17-2 is formed to fill the plurality of holes H1, a light absorption layer 19 may be formed on the seed layer 17-1 or 17-2 and the insulating pattern layer 15-1 or 15-2 (S109). In this case, the seed layer 17-1 or 17-2 may be grown by using an epitaxial growth process, and even if the plurality of holes H1 are filled with the seed layer 17-1 or 17-2, the epitaxial growth process may be continued. As a result, the light absorption layer 19 may be unified with the seed layer 17-1 or 17-2. A second insulating layer may be formed on a top surface of the light absorption layer 19 (S111), and electrodes 27A and 27B may be formed on top surfaces of the light absorption layer 19 and the crystalline layer 13-1 to externally output an electric signal generated by the light absorption layer 19 (S113).

In the operation S105 of forming the insulating pattern layer 15-1 or 15-2, a shape of the seed layer 17-1 or 17-2 may depend on a shape of the plurality of holes H1. In the photodiode 100 shown in FIGS. 1 to 2B, the insulating pattern layer 15-1 may define a plurality of island-shaped holes spaced apart from one another, and the seed layer 17-1 may include a plurality of pillar-type structures spaced apart from one another. Also, in the photodiode 200 shown in FIGS. 5 to 6B, the insulating pattern layer 15-2 may define a plurality of line-shaped holes spaced apart from one another, and the seed layer 17-2 may include a plurality of line-shaped structures spaced apart from one another.

Figure 14:
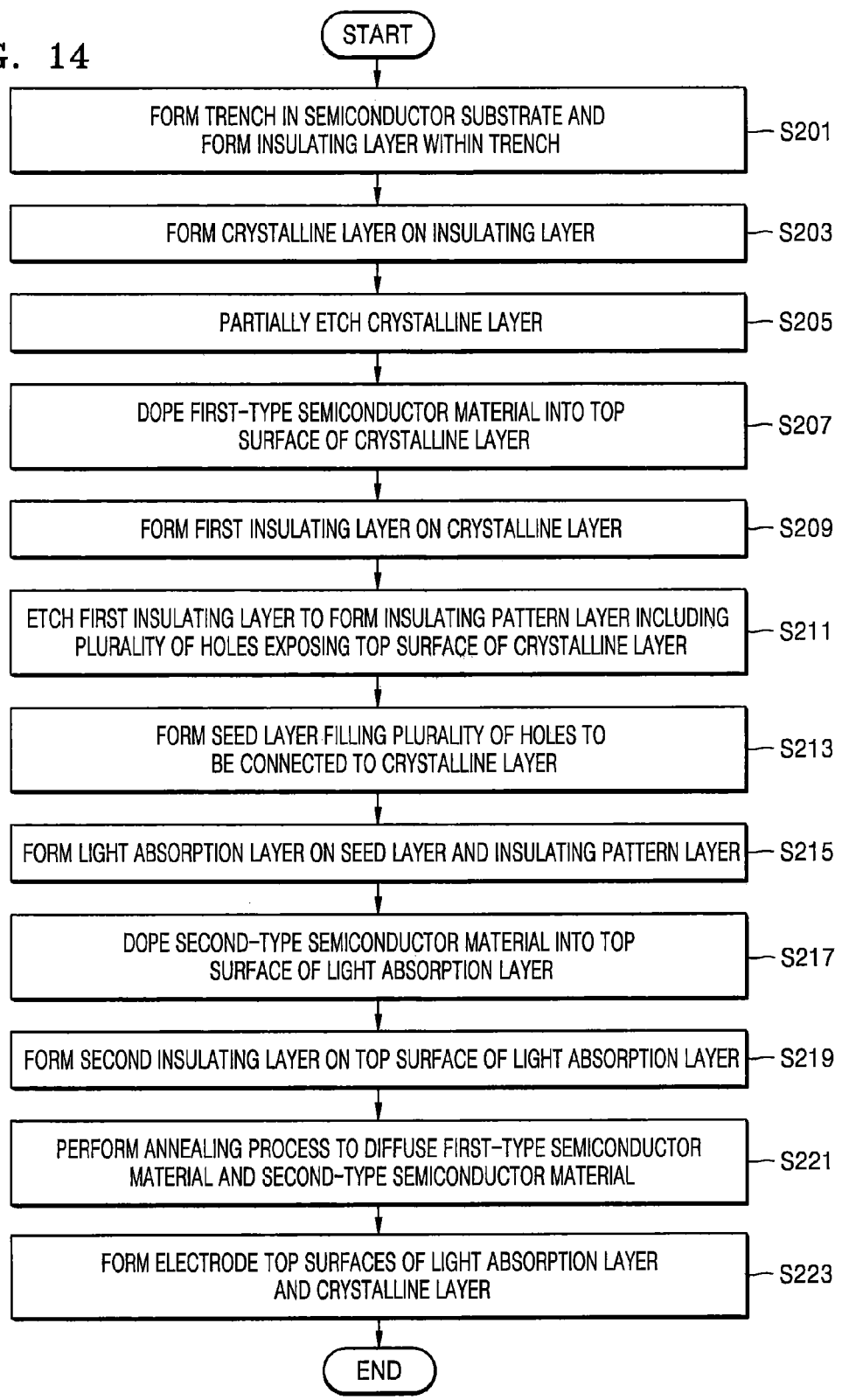
FIG. 14 is a flowchart illustrating a method of manufacturing the photodiode, according to an example embodiment.

FIG. 14 is a flowchart of a method of manufacturing the photodiode 300 of FIG. 7, according to an example embodiment.

Referring to FIGS. 7 to 10B and 14, a trench may be formed in a semiconductor substrate 11, and a buried insulating layer 31 may be formed in the trench (S201). After a crystalline layer 13-2 is formed on the buried insulating layer 31 (S203), the crystalline layer 13-2 may be partially etched (S205). In this case, the crystalline layer 13-2 may be etched in at least one line shape disposed on the buried insulating layer 31, and a light signal Ls may be transmitted into the line-shaped crystalline layer 13-2. A first semiconductor material layer may be formed on the crystalline layer 13-2 to give polarity to the light absorption layer 19 (S207). After a first insulating layer is formed on the crystalline layer 13-2 (S209), the first insulating layer may be etched to form an insulating pattern layer 15-3 including a plurality of holes H1 exposing a top surface of the line-shaped crystalline layer 13-2 (S211). In this case, a shape of a seed layer 17-3 or 17-4 may depend on a shape of the plurality of holes H1. In each of the photodiodes 300A, 300B, and 300C shown in FIGS. 8A to 10B, the plurality of holes H1 may have a plurality of island shapes spaced apart from one another. Thereafter, the seed layer 17-3 or 17-4 may be formed to fill the plurality of holes H1 and connected to the crystalline layer 13-2 (S213). Thus, the seed layer 17-3 or 17-4 may have a plurality of pillar-type structures spaced apart from one another. Subsequently, a light absorption layer 19 may be formed on the seed layer 17-3 or 17-4 and the insulating pattern layer 15-3 (S215). A second semiconductor material layer, which has different electrical properties from the first semiconductor material layer, may be doped into a top surface of the light absorption layer 19 to give polarity to the light absorption layer 19 (S217). A second insulating layer 23 may be formed on the top surface of the light absorption layer 19 (S219). In this case, an annealing process may be performed to diffuse impurities in the first semiconductor material layer and the second semiconductor material layer (S221). In this case, diffusivities of semiconductor materials may be controlled by adjusting annealing conditions. The photodiodes 300A and 300C shown in FIGS. 8A, 8B, 10A, and 10B may be manufactured by performing an annealing process to such an extent that the first semiconductor material layer included in the top surface of the crystalline layer 13-2 diffuses only in the crystalline layer 13-2. Alternatively, an annealing process may be performed by modifying time or temperature conditions so that the first semiconductor material layer included in the top surface of the crystalline layer 13-2 diffuses into the seed layer 17-4 connected to the top surface of the crystalline layer 13-2. In this case, the photodiode 300B shown in FIGS. 9A and 9B may be manufactured. Subsequently, contact plugs 25A and 25B may be respectively formed on top surfaces of the light absorption layer 19 and the crystalline layer 13-2, and electrodes 27A and 27B may be respectively formed on and connected to top surfaces of the contact plugs 25A and 25B. Thus, an electric signal generated by the light absorption layer 19 may be externally output (S223).

Figure 15:
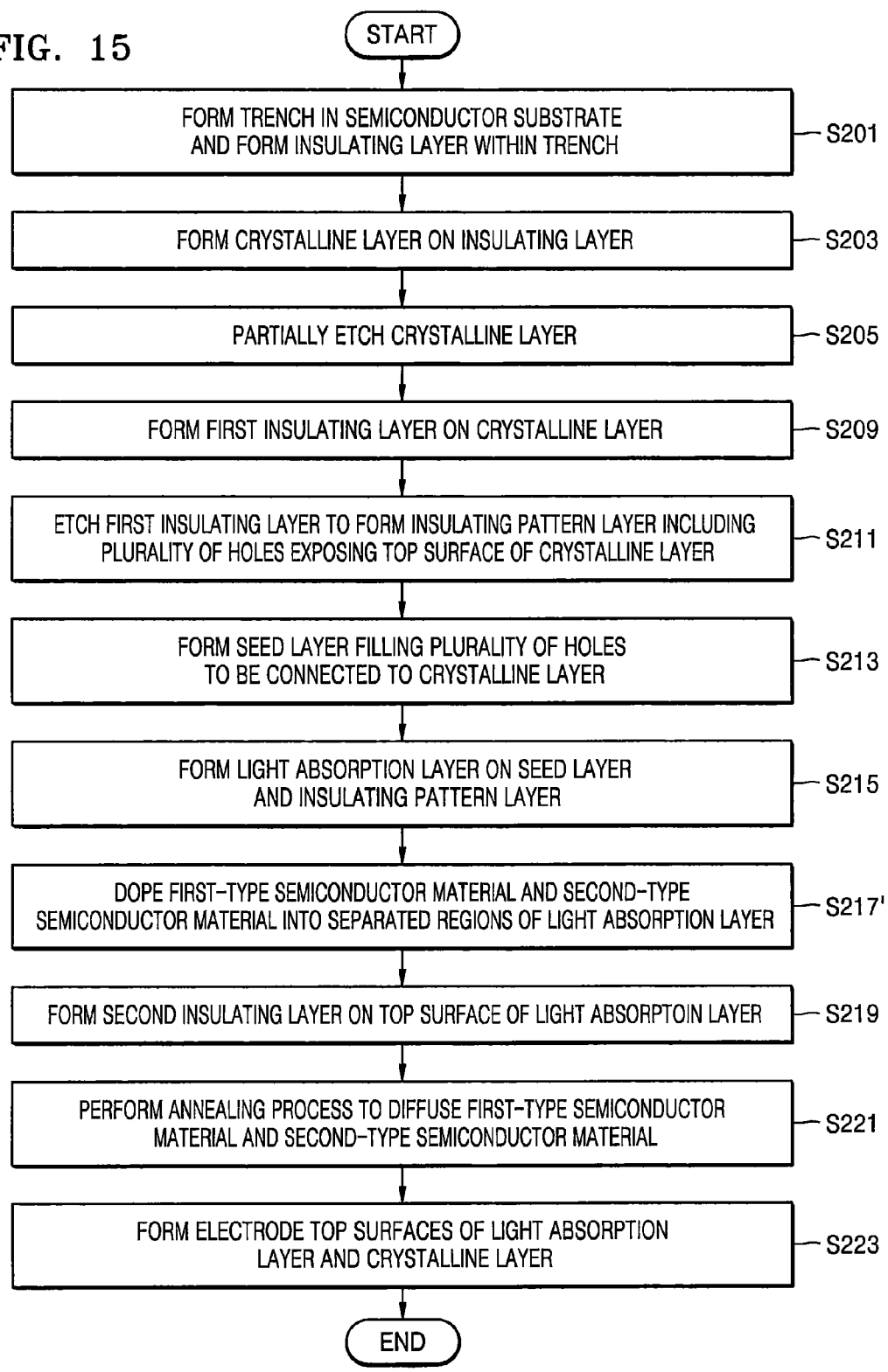
FIG. 15 is a flowchart illustrating a method of manufacturing a photodiode according to an example embodiment.

FIG. 15 is a flowchart of a method of manufacturing the photodiode 300C shown in FIGS. 10A and 10B, according to an example embodiment. The method shown in FIG. 15 is similar to the method shown in FIG. 15 except for a process of forming first and second semiconductor material layers.

Referring to FIG. 15, an operation S207 of forming a first semiconductor material layer and an operation S217 of forming a second semiconductor material layer may be modified because polarity is given to the light absorption layer 19 during the operations S207 and S217. Accordingly, the operations S207 and 217 of forming the first and second semiconductor material layers may be omitted, and an operation S217' of respectively forming a first semiconductor material layer and a second semiconductor material layer on separated regions of the light absorption layer 19 may be added between the operation S215 of forming the light absorption layer 19 and the operation S219 of forming a second insulating layer 23 on a top surface of the light absorption layer 19. Thus, the photodiode 300C shown in FIGS. 10A and 10B may be manufactured.

FIGS. 16A to 19 are cross-sectional views of a method of manufacturing the photodiodes 300A, 300B, and 300C shown in FIGS. 7 to 8B, according to an example embodiment. FIGS. 16A, 17A, 18A, and 19 are cross-sectional views corresponding to the line A-A' of FIG. 7, and FIGS. 16B, 17B, and 18B are cross-sectional views corresponding to the line B-B' of FIG. 7. Also, FIGS. 16C, 17C, and 18C are plan views of the photodiode 300a of FIG. 7.

Figure 16A:
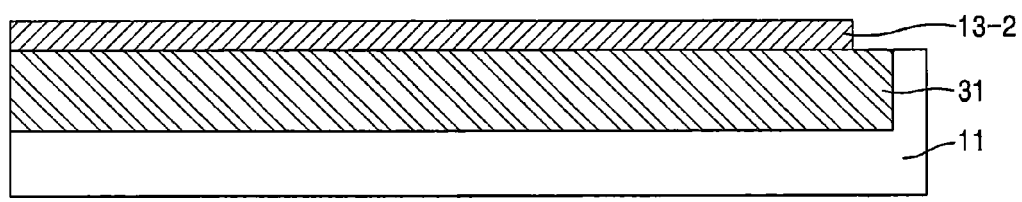
FIGS. 16A to 20C are cross-sectional views of a photodiode according to an example embodiment.
Figure 16B:
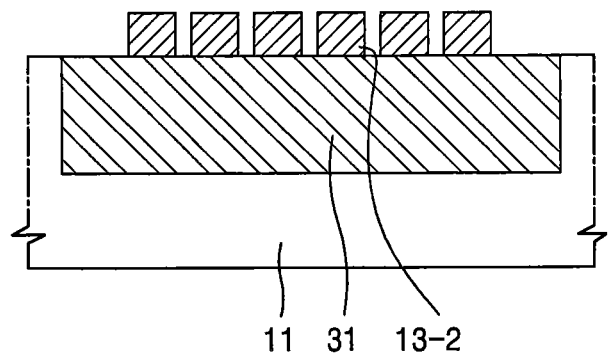
Figure 16C:
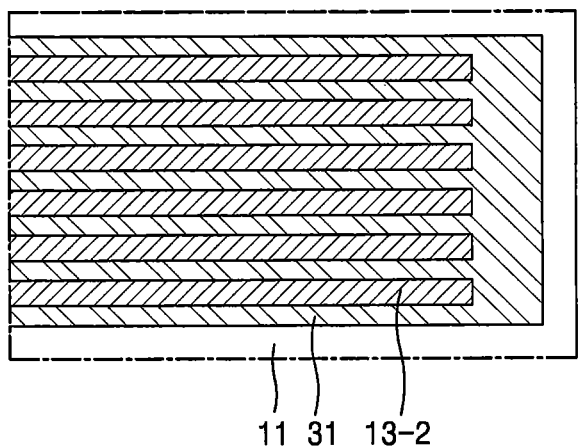

Referring to FIGS. 16A to 16C, a trench may be formed in a semiconductor substrate 11, for example, a bulk silicon substrate, and the trench may be filled with a buried insulating layer 31, for example, an oxide. An amorphous layer, for example, an amorphous silicon (a-Si) layer, may be formed on the semiconductor substrate 11 and the buried insulating layer 31. The amorphous layer may be single-crystallized by using an annealing process into a crystalline layer 13-2, for example, a crystalline silicon layer. The crystalline layer 13-2 may be partially etched to form a plurality of lines disposed on the buried insulating layer 31. As a result, a line-shaped crystalline layer 13-2 including six lines may be formed on the buried insulating layer 31. By etching the crystalline layer 13-2, portions of the semiconductor substrate 11 and the buried insulating layer 31 may be externally exposed.

Figure 17A:
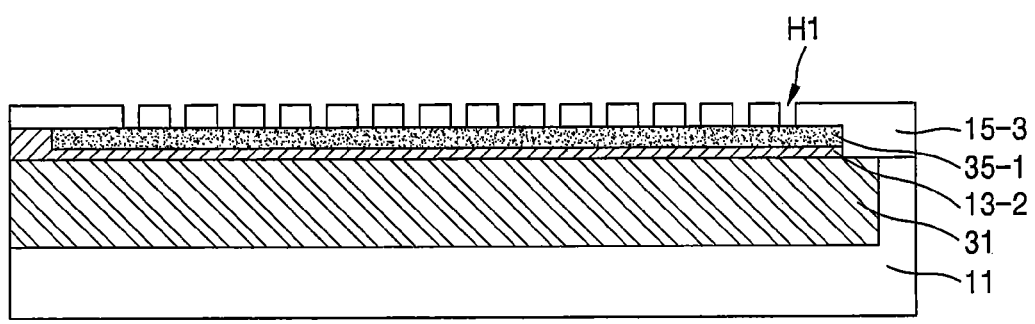
Figure 17B:
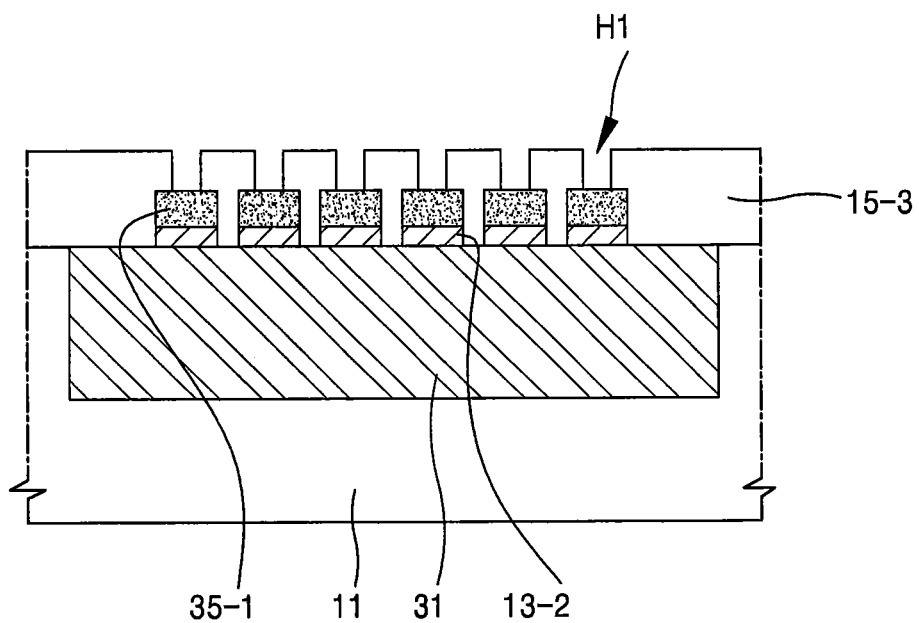
Figure 17C:
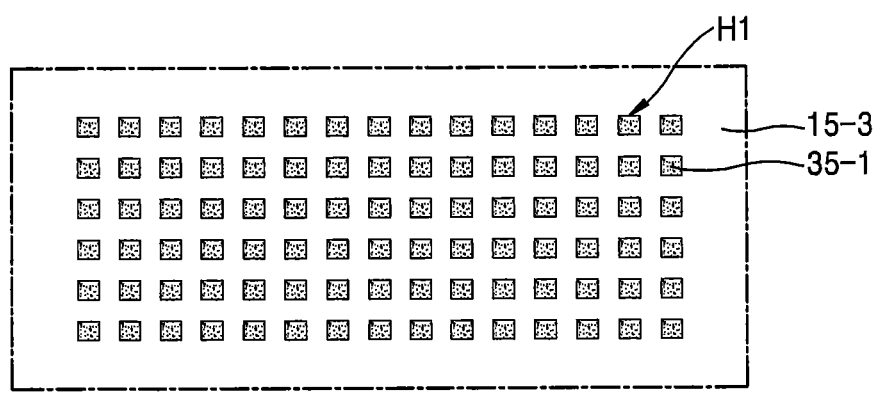

Referring to FIGS. 17A to 17C, a first semiconductor material may be doped into a top surface of the line-shaped crystalline layer 13-2 shown in FIGS. 16A to 16C, and an insulating layer may be formed on the semiconductor substrate 11, the buried insulating layer 31, and the crystalline layer 13-2 that are externally exposed. The insulating layer may be partially etched to form an insulating pattern layer 15-3 including a plurality of holes H1 exposing the top surface of the crystalline layer 13-2. As a result, the insulating pattern layer 15-3 may include a plurality of holes H1 arranged in a matrix shape including 15 rows and 6 lines.

Figure 18A:
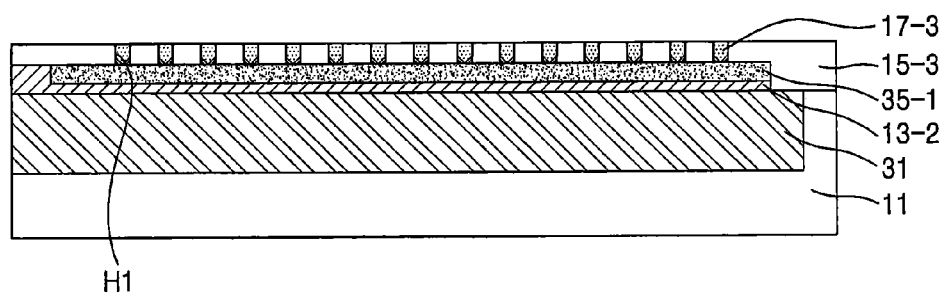
Figure 18B:
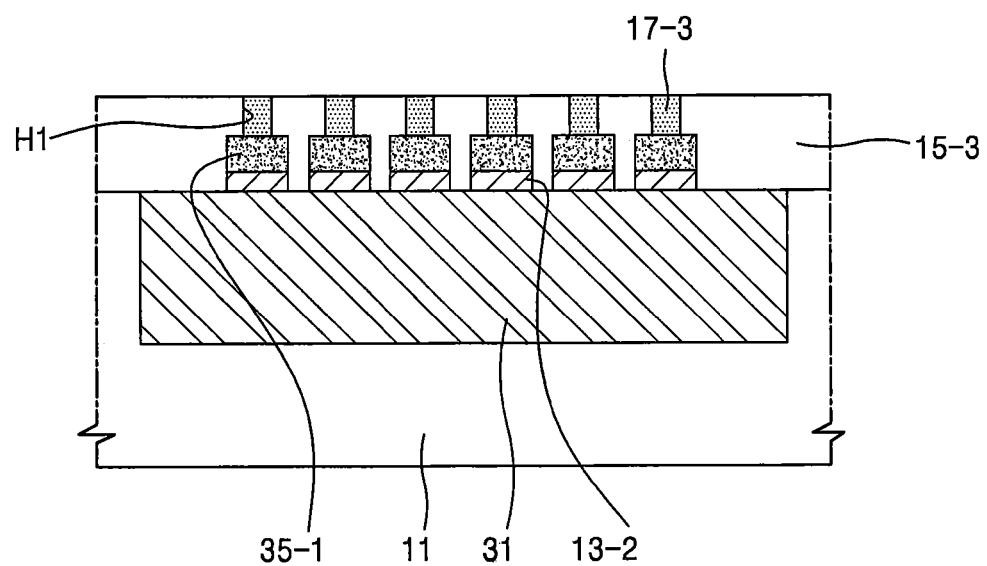
Figure 18C:
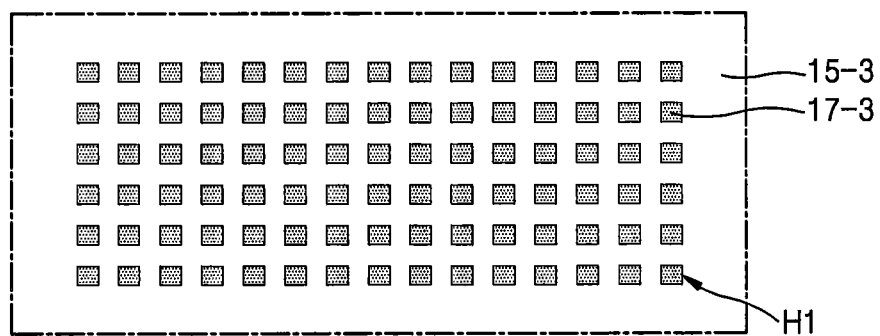

Referring to FIGS. 18A to 18C, a seed layer 17-3 may be formed using, for example, a germanium layer, to fill the plurality of holes H1 shown in FIGS. 17A to 17C. In this case, the seed layer 17-1 may be formed by using an epitaxial growth process.

Figure 19:
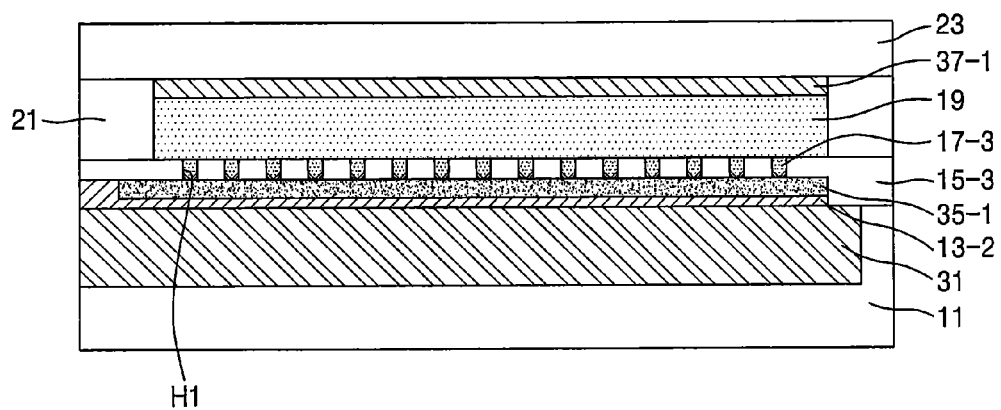

Referring to FIG. 19, a light absorption layer 19 may be formed using, for example, a germanium layer, on the seed layer 17-3 shown in FIGS. 18A to 18C. In this case, after the seed layer 17-3 is formed to fill the plurality of holes H1 shown in FIGS. 17A to 17C, the light absorption layer 19 may be formed by excessively growing the seed layer 17-3 to cover the insulating pattern layer 15-3. In other example embodiments, after the seed layer 17-3 is excessively grown, the excessively grown seed layer 17-3 may be etched by using, for example, a chemical mechanical polishing (CMP) process such that a top surface of the seed layer 17-3 is at the same level as a top surface of the insulating pattern layer 15-3. Thus, a direction in which the seed layer 17-3 is grown may be cut off from a direction in which the light absorption layer 19 is grown. In this case, the light absorption layer 19 may be separately formed on planar top surfaces of the seed layer 17-3 and the insulating pattern layer 15-3. The light absorption layer 19 may be partially etched to an appropriate size for light absorption. A second semiconductor material may be doped into a top surface of the light absorption layer 19. An insulating layers 21 may be formed to define the light absorption layer 19 and a insulating layer 23 may cover a top surface of the light absorption layer 19. Thereafter, contact plugs and electrodes may be formed through the first and second insulating layers 21 and 23 and/or the insulating pattern layer 15-3 to be respectively connected to first and second regions 35-1 and 37-1 that include first and second semiconductor materials, respectively. Thus, the photodiode 300A shown in FIGS. 8A and 8B may be manufactured.

Alternatively, the first and second semiconductor material layers are formed and then annealed so that the seed layer 17-4 may include a third semiconductor material layer including the same material as the first semiconductor material layer. Thus, the photodiode 300B shown in FIGS. 9A and 9B may be manufactured.

Alternatively, the first and second semiconductor material layers may be formed on a top surface of the light absorption layer 19 to be apart from each other. Thus, the photodiode 300C shown in FIGS. 10A and 10B may be manufactured.

Alternatively, a process of forming the buried insulating layer 31 in the semiconductor substrate 11 and a process of partially etching the crystalline layer 13-2 may be omitted, thereby completing manufacture of the photodiodes 100 and 200 shown in FIGS. 1 to 6B.

Figure 20A:
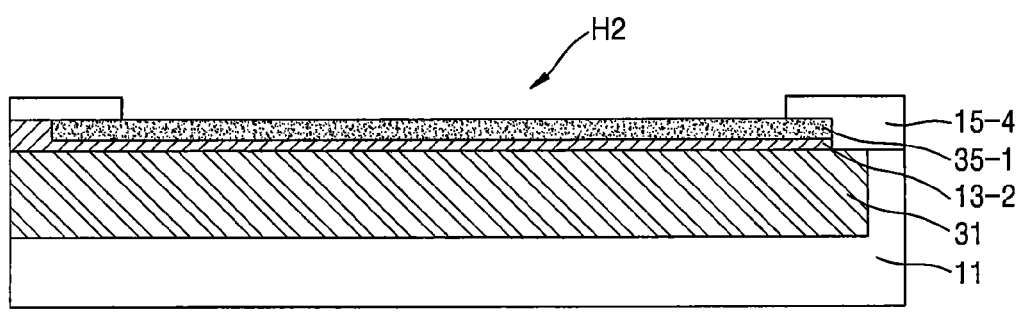
Figure 20B:
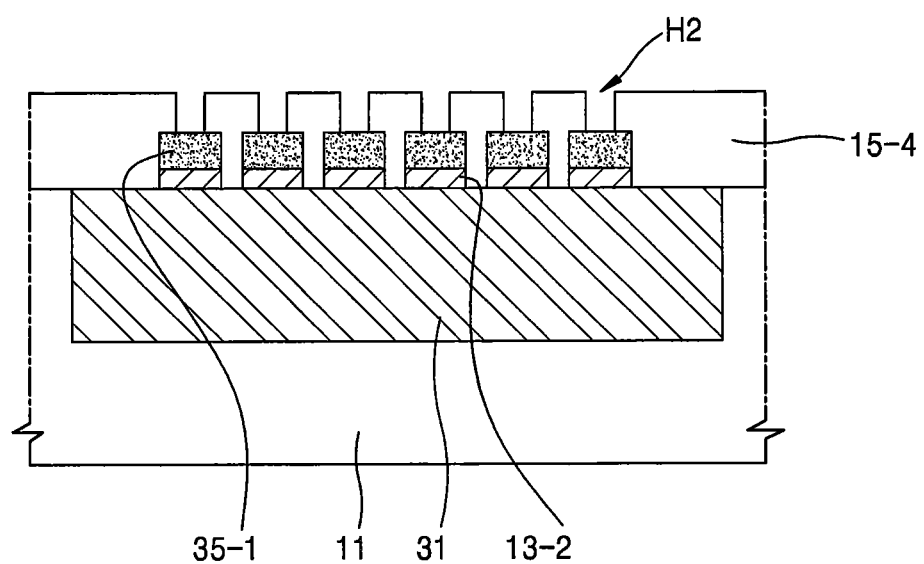
Figure 20C:
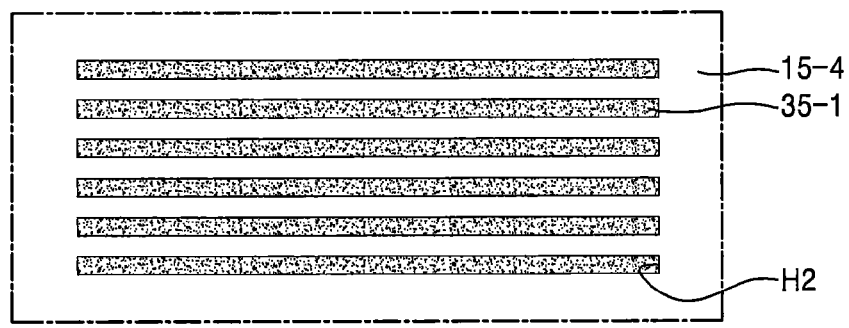

FIGS. 20A to 20C are cross-sectional views of a method of manufacturing the photodiode 400 shown in FIGS. 7, 12A, and 12B, according to an example embodiment. The method of manufacturing the photodiode 400 is the same as the method shown in FIGS. 16A to 19 except that processes to be described with reference to FIGS. 20A to 20C are performed instead of the processes described with reference to FIGS. 17A to 17C. Referring to FIGS. 20A to 20C, a first semiconductor material may be doped into the top surface of the line-shaped crystalline layer 13-2 shown in FIGS. 16A to 16C, and an insulating layer may be formed on the semiconductor substrate 11, the buried insulating layer 31, and the crystalline layer 13-2 that are externally exposed. The insulating layer may be partially etched to form an insulating pattern layer 15-4 including a plurality of holes H2 exposing a top surface of the crystalline layer 13-2. As a result, the insulating pattern layer 15-4 may include six line-shaped holes H1. Thereafter, subsequent processes described with reference to FIGS. 18A to 19 may be performed in the same manner. Specifically, a seed layer 17-5 may be formed in the six line-shaped holes H1, and a light absorption layer 19 may be formed on the seed layer 17-5 including six line shapes, thereby completing manufacture of the photodiode 400.

Figure 21:
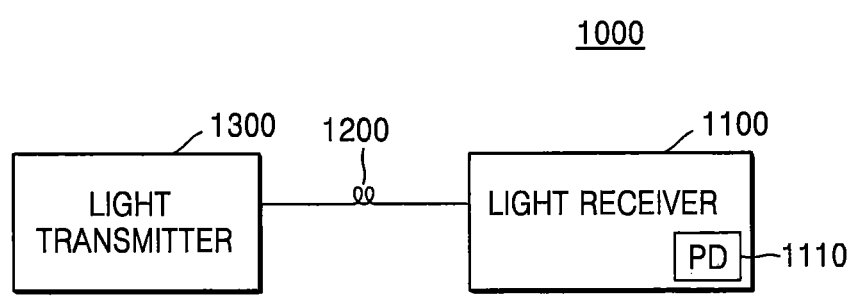
FIG. 21 is a diagram of an optical communication system including a photodiode according to an example embodiment.

FIG. 21 is a diagram of an optical communication system 1000 including a photodiode according to an example embodiment.

Referring to FIG. 21, the optical communication system 1000 may include a light receiver 1100, a channel 1200, and a light transmitter 1300. The light transmitter 1300 may convert an electric signal into a light signal and transmit the light signal through a channel 1200 to the light receiver 1100. The light receiver 1100 may convert the input light signal into an electric signal again.

The photodiode 1110 included in the light receiver 1100 may be at least one of the photodiodes 100, 200, 300, 300A, 300B, 300C, and 400 described with reference to FIGS. 1 to 12B or photodiodes manufactured by using the methods described with reference to FIGS. 13 to 20C. That is, the photodiode 1110 may include a crystalline layer, which may transmit the light signal and be formed on an insulating layer formed in a trench of a semiconductor substrate, a plurality of seed structures, which may be connected to a top surface of the crystalline layer and transmit the light signal, a light absorption layer, which may be connected to the plurality of seed structures and absorb the light signal, and an electrode configured to transmit an electric signal generated due to the light signal in the light absorption layer.

The channel 1200 may be a path through which a light signal passes, and may be embodied by using optical fibers.

While the inventive concepts have been particularly shown and described with reference to example embodiments thereof, it will be understood that various changes in form and details may be made therein without departing from the spirit and scope of the following claims.

What is claimed is:

1. A photodiode comprising:
a semiconductor substrate comprising a trench;
an insulating layer in the trench;
a crystalline layer on the semiconductor substrate, wherein a top surface of the crystalline layer includes a first region including a first semiconductor material layer;
an insulating pattern layer on the crystalline layer and defining a plurality of holes exposing a top surface of the crystalline layer;
a seed layer in the plurality of holes and directly on the crystalline layer, wherein a top surface of the seed layer is co-planar with a top surface of the insulating pattern layer;
a light absorption layer directly on the seed layer and the insulating pattern layer, wherein a top surface of the light absorption layer is planar and includes a second region including a second semiconductor material layer that comprises a different material from the first semiconductor material layer;
a first contact plug electrically connected to the first semiconductor material layer; and
a second contact plug electrically connected to the second semiconductor material layer.

2. The photodiode of claim 1, wherein the crystalline layer is on the insulating layer.

3. The photodiode of claim 2, wherein the crystalline layer extends on the insulating layer and comprises at least one line shape.

4. The photodiode of claim 2, wherein a refractive index of the crystalline layer is higher than a refractive index of the insulating layer.

5. The photodiode of claim 1, wherein the plurality of holes comprise a plurality of island-shaped holes that are spaced apart from one another.

6. The photodiode of claim 1, wherein the plurality of holes comprise a plurality of line-shaped holes that are spaced apart from one another.

7. The photodiode of claim 1, wherein the seed layer includes an epitaxial growth layer.

8. The photodiode of claim 1, wherein light transmitted through the crystalline layer is transmitted through the seed layer to the light absorption layer, in a direction perpendicular to the light absorption layer.

9. The photodiode of claim 1, wherein the seed layer includes a third semiconductor material layer that comprises a same material as the first semiconductor material layer.

10. The photodiode of claim 1, further comprising an electrode connected to the light absorption layer.

11. The photodiode of claim 1, wherein a thickness of the light absorption layer is greater than a thickness of the seed layer.

\* \* \* \* \*